United States Patent [19]

Ema et al.

[11] Patent Number: 5,323,046
[45] Date of Patent: Jun. 21, 1994

[54] SEMICONDUCTOR DEVICE AND METHOD FOR PRODUCING SEMICONDUCTOR DEVICE

[75] Inventors: Taiji Ema; Kazuo Itabashi, both of Kawasaki, Japan

[73] Assignee: Fujitsu Limited, Kawasaki, Japan

[21] Appl. No.: 910,001

[22] Filed: Jul. 7, 1992

[30] Foreign Application Priority Data

Jul. 8, 1991 [JP] Japan ................... 3-166991

[51] Int. Cl.⁵ .................. H01L 29/04; H01L 21/469
[52] U.S. Cl. ..................... 257/382; 257/401; 257/412; 257/751; 257/754; 257/774; 437/149; 437/153; 437/191; 437/196; 437/233; 437/913
[58] Field of Search ............ 257/382, 401, 412, 751, 257/754, 774; 437/15, 149, 153, 191, 196, 233, 913

[56] References Cited

U.S. PATENT DOCUMENTS

| | | | |
|---|---|---|---|
| 4,291,322 | 9/1981 | Clemens | 257/382 |
| 5,191,397 | 3/1993 | Yoshida | 257/382 |
| 5,206,532 | 4/1993 | Roberts | 257/382 |

*Primary Examiner*—Edward Wojciechowicz
*Attorney, Agent, or Firm*—Staas & Halsey

[57] ABSTRACT

Semiconductor devices and methods for producing semiconductor devices to be produced by conducting a combination of a step for producing a gate elctrode of a first conductor layer which is piled on a gate insulator, a step for producing a drain region which is connected with an n+-region located under the gate electrode by employing the gate electrode as a part of the mask, and a step for piling, on or over the gate electrode, a second conductor layer connected with the n+-region through a contact hole produced in the gate electrode.

20 Claims, 32 Drawing Sheets

BL  /BL

Fig. 20       PRIOR ART
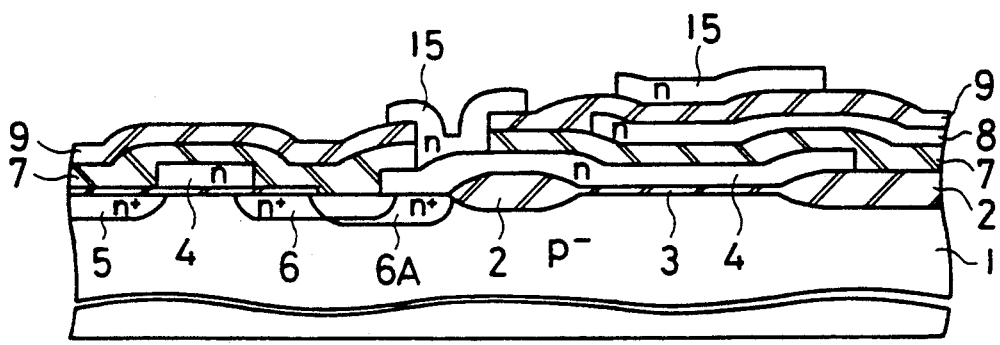
Fig. 21       PRIOR ART
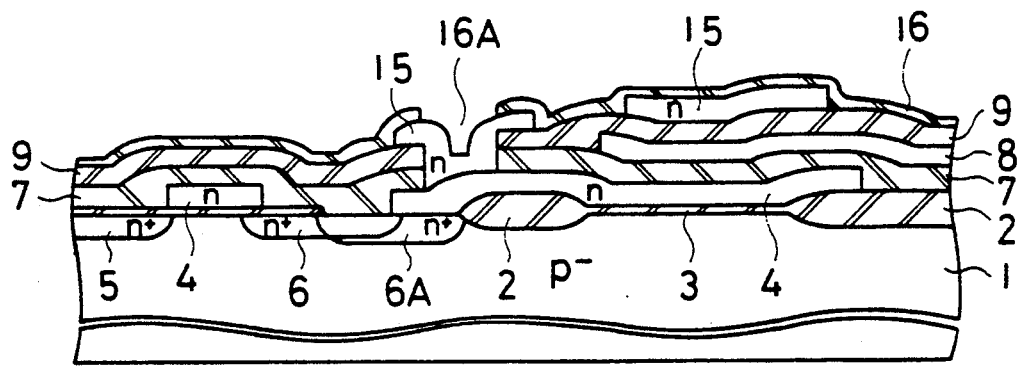

SEMICONDUCTOR DEVICE AND METHOD FOR PRODUCING SEMICONDUCTOR DEVICE

BACKGROUND OF THE INVENTION

This invention relates to an improvement applicable to semiconductor devices and methods for producing a semiconductor device. More specifically, this invention relates to an improvement applicable to static random access memories (hereinafter referred to as SRAMs) e.g. a high resistance load type SRAM and a thin film transistor (hereinafter referred to as a TFT) load type SRAM.

An SRAM is classified into a high resistance load type SRAM and a TFT load type SRAM. These SRAMs are involved with various fundamental problems to be further removed, the fundamental problems including e.g. connection of a driver transistor and a load.

A method for producing a high resistance load type SRAM will be described below.

FIGS. 1 through 7 are cross-sectional views of a semiconductor wafer illustrated for describing the process for producing a high resistance load type SRAM available in the prior art. FIGS. 8 through 13 are plan views of a semiconductor wafer corresponding to FIGS. 1 through 7. The cross section of the cross-sectional views is shown by Y—Y line illustrated in FIG. 13.

Referring to FIG. 1, the LOCOS process is conducted to produce a field insulator layer 2 having a thickness of e.g. 4,000 Å on selected areas of a $p^-$-Si substrate 1. $Si_3N_4$ mask layer (not shown) employed for the LOCOS process is removed, and the active regions are exposed. The surface of the active region is oxidized to produce a gate insulator layer 3 having a thickness of e.g. 100 Å on the active region. The gate insulator layer 3 is selectively removed to produce a contact hole 3A by conducting a wet etching process which employs hydrofluoric acid as the etchant.

Referring to FIGS. 2 and 8, a chemical vapor deposition process (hereinafter referred to as a CVD process) is conducted to produce a first poly crystalline silicon layer 4a having a thickness of e.g. 1,500 Å. A gaseous phase diffusion process is conducted to introduce n-type impurities (e.g. phosphorus and arsenic) into the $p^-$-Si substrate, and an $n^+$-region 5' containing n-type impurities by e.g. $1 \times 10^{21}$ cm$^{-3}$ is produced.

Referring to FIG. 3, a reactive ion etching process (hereinafter referred to as RIE process) is conducted to selectively pattern the first poly crystalline silicon layer 4a for the purpose to produce a gate electrode 4 which actually acts as a wire line or a gate electrode of a driver transistor. A mixture of $CCl_4$ gas and $O_2$ gas is employed as the etching gas of the RIE process. An ion implantation process is conducted to introduce arsenic ions (n-ions) into the $p^-$-Si substrate 1, and a source region 5 and a drain region 6 are produced.

Referring to FIG. 4 and FIG. 9, a CVD process is conducted to produce an $SiO_2$ layer 7 having a thickness of e.g. 1,000 Å. A RIE process is conducted to produce a contact hole 7A for a ground line shown in FIG. 9. For this RIE process, a resist mask is employed, and a mixture of $CHF_3$ gas and He gas is employed as the etching gas. A CVD process is conducted to produce a second poly crystalline silicon layer, having a thickness of e.g. 1,500 Å which is patterned into a ground line 8 by conducting a RIE process in which a mixture of $CCl_4$ gas and $O_2$ gas is employed as the etching gas.

Referring to FIGS. 5 and 10, a CVD process is conducted to produce an $SiO_2$ layer 9 having a thickness of e.g. 1,000 Å. A RIE process is conducted to produce a contact hole 9A for a load resister, in the $SiO_2$ layers 9 and 7. A mixture of $CHF_3$ and He is employed as the etching gas for the RIE process.

Referring to FIG. 6, a CVD process is conducted to produce a third poly crystalline silicon layer having a thickness of e.g. 1,500 Å. Arsenic ions (n-ions) are selectively introduced to the region which is scheduled to be the feeder of a positive power supply $V_{cc}$ and a region at which a high resistance load contacts with the gate electrode 4. For this ion implantation process, a resist mask is employed and a preferable dosage and a preferable acceleration energy are respectively $1 \times 10^{15}$ cm$^{-2}$ and 30 KeV. A RIE process is conducted to pattern the third poly crystalline silicon layer for the purposes to produce a contact part 10, a high resistance load 11 and a feeder 12 of the positive power supply $V_{cc}$. A mixture of $CCl_4$ gas and $O_2$ gas is employed as the etching gas of this RIE process.

Referring to FIGS. 7 and 11, a CVD process is conducted to produce an insulator layer 13 consisting of an $SiO_2$ layer having a thickness of e.g. 1,000 Å and a phosphosilicate glass layer having a thickness of e.g. 5,000 Å. A reflow process is conducted to make the surface of the insulator layer 13 flat. A resist process and a RIE process are conducted to produce contact holes 13A for a bit line, in the insulator layer 13.

Referring to FIGS. 7 and 12, a sputtering process is conducted to produce an Al layer having a thickness of e.g. 1 micrometer, and a photolithography process is conducted to pattern the Al layer for the purpose to produce a bit line 14. The significance of the elements e.g. BL etc. which are shown in FIGS. 7 and 12 but are not discussed above will be clear, when FIG. 14 is referred to.

FIG. 13 is the plan view of a finished high resistance load type SRAM produced by the process described above, referring to FIGS. 1 through 12 and the same emblems as were employed in FIGS. 1 through 12 are employed also in FIG. 13. For the simplicity's sake, however, the bit line 14 shown in FIGS. 7 and 12 are not illustrated in FIG. 13.

FIG. 14 is an equivalent circuit of the high resistance load type SRAM produced by the process described above, referring to FIGS. 1 through 13.

Referring to FIG. 14, $Q_1$ and $Q_2$ indicate driver transistors, $Q_3$ and $Q_4$ indicate transfer gate transistors, $R_1$ and $R_2$ indicate high resistance load, WL indicates a word line, BL and /BL indicate bit lines, $S_1$ and $S_2$ indicate nodes, $V_{cc}$ indicates a positive power supply, and $V_{ss}$ indicates a negative power supply.

The function of the foregoing high resistance load type SRAM will be described below.

The positive power supply $V_{cc}$ is selected to be 5 V and the negative power supply $V_{ss}$ is selected to be 0 V. Supposing the voltage of the node $S_1$ is 5 V and the voltage of the node $S_2$ is 0 V, the transistor $Q_2$ is ON and the transistor $Q_1$ is OFF. Provided the transistor $Q_1$ is OFF and the resistance thereof is sufficiently higher than that of the high resistance load $R_1$, the voltage of the node $S_1$ is kept at 5 V. On the other hand, provided the transistor $Q_2$ is ON and the resistance thereof is sufficiently less than that of the high resistance load $R_2$, the voltage of the node $S_2$ is kept at 0 V.

This operation is, however, involved with a drawback wherein a DC current whose intensity is inverse proportional to the resistance of the high resistance load $R_2$, flows from the positive power supply $V_{cc}$ toward the negative power supply $V_{ss}$.

Since the quantity of the memory cells integrated in one chip of the foregoing high resistance load type SRAM increases following an increase in integration, the total power consumption of one chip increases, unless the power consumption of a memory cell is decreased. Therefore, the foregoing DC current is required to be decreased. To satisfy this requirement, the value of the high resistance load $R_2$ and $R_1$ is required to be increased. In the case where this resistance is increased, however, the potential of the node connected to the driver transistor which is then OFF, $S_1$ in this case, can hardly be kept stable.

For the purpose to remove the foregoing drawbacks, a TFT load type SRAM was developed.

A method for producing a TFT load type SRAM will be described below.

FIGS. 15 through 23 are cross-sectional views of a semiconductor wafer illustrated for describing the process for producing a TFT load type SRAM available in the prior art. FIG. 24 is a plan view of a TFT load type SRAM. The cross section of the cross-sectional views is shown by Y—Y line illustrated in FIG. 24.

Referring to FIG. 15, the LOCOS process is conducted to produce a field insulator layer 2 having a thickness of e.g. 4,000 Å on selected areas of a $p^-$-Si substrate 1. $Si_3N_4$ mask layers (not shown) employed for the LOCOS process are removed, and the active areas are exposed. The surface of the active area is oxidized to produce a gate insulator layer 3 having a thickness of e.g. 100 Å on the active area. The gate insulator layer 3 ia selectively removed to produce a contact hole 3A by conducting a wet etching process which employs hydrofluoric acid as the etchant.

Referring to FIG. 16, a CVD process is conducted to produce a first poly crystalline silicon layer 4a having a thickness of e.g. 1,500 Å. A gaseous phase diffusion process is conducted to introduce phosphorus (n-type impurities) into the $p^-$-Si substrate, and an $n^+$-region 6A containing n-type impurities by e.g. $1 \times 10^{21}$ cm$^{-3}$ is produced.

Referring to FIG. 17, a RIE process is conducted to pattern the first poly crystalline silicon layer 4a for the purpose to produce a gate electrode 4 which actually acts as a wire line or the gate electrode of a driver transistor. A mixture of $CCl_4$ gas and $O_2$ gas is employed as the etching gas of the RIE process. An ion implantation process is conducted to introduce arsenic ions (n-ions) into the $p^-$-Si substrate 1, and a source region 5 and a drain region 6 are produced.

Referring to FIG. 18, a CVD process is conducted to produce an $SiO_2$ layer 7 having a thickness of e.g. 1,000 Å. A RIE process is conducted to produce a contact hole 7A (See FIG. 24) for a ground line. A CVD process is conducted to produce a second poly crystalline silicon layer, which is patterned into a ground line 8 by conducting a RIE process in which a mixture of $CCl_4$ gas and $O_2$ gas is employed as the etching gas.

Referring to FIG. 19, a CVD process is conducted to produce an $SiO_2$ layer 9 having a thickness of e.g. 1,000 Å. A RIE process is conducted to produce a contact hole 9A in the $SiO_2$ layers 9 and 7. For the process, a resist mask (not shown) is employed and a mixture of $CHF_3$ and He is employed as the etching gas.

Referring to FIG. 20, a CVD process is conducted to produce a third poly crystalline silicon layer having a thickness of e.g. 1,500 Å. Phosphorus ions (n-ions) are introduced in the third poly crystalline silicon layer. A preferable dosage and a preferable acceleration energy are respectively $1 \times 10^{15}$ cm$^{-2}$ and 20 KeV. A RIE process is conducted to pattern the third poly crystalline silicon layer to produce a gate electrodes 15 of a TFT, which acts as loads of a TFT load type SRAM. For this RIE process, a resist mask is employed, and a mixture of $CCl_4$ and $O_2$ is employed as the etching gas.

Referring to FIG. 21, a CVD process is conducted to produce an $SiO_2$ layer 16 having a thickness of e.g. 300 Å, the $SiO_2$ layer 16 acting as the gate insulator layer of the TFT. A drain contact hole 16A is produced by applying a wet etching process to the $SiO_2$ layer 16.

Referring to FIG. 22, a CVD process is employed to produce a fourth poly crystalline silicon layer having a thickness of e.g. 500 Å. An ion implantation process is conducted to introduce boron (n-type impurities) into the regions where sources and drains of a TFT are scheduled to be produced and where the feeder of the $V_{cc}$ power supply is scheduled to be produced. The ion implantation process is conducted with the dosage of $1 \times 10^{14}$ cm$^{-2}$ and the acceleration energy of 5 KeV. The region where the feeder of the $V_{cc}$ power supply is scheduled to be produced is illustrated in FIG. 24. A RIE process is conducted to pattern the fourth poly crystalline silicon layer, and the source region 17, the drain region 18 and channel region 19 of the TFT, and the feeder of the $V_{cc}$ power supply are produced. A mixture of $CCl_4$ gas and $O_2$ gas is employed as the etching gas for the RIE process.

Referring to FIG. 23, a CVD process is conducted to produce an insulator layer 21 consisting of an $SiO_2$ layer (lower layer) having a thickness of e.g. 1,000 Å and a PSG layer (upper layer) having a thickness of e.g. 5,000 Å. A reflow process is conducted to make the surface of the PSG layer flat. A RIE process is conducted to produce a contact hole for a bit line, on the insulator layer 21. For this RIE process, a resist mask is employed, and a mixture of $CHF_3$ and He is employed as the etching gas. A sputtering process is conducted to produce an Al layer having a thickness of e.g. 1 micrometer. Thereafter, a photolithography process is employed to produce a bit line 22.

FIG. 24 is a plan view of a finished TFT load type SRAM produced by the process described above, referring to FIGS. 15 through 23, and the same emblems as were employed in FIGS. 15 through 23 are employed also in FIG. 24. For the simplicity's sake, however, the bit line 22 shown in FIG. 23 are not illustrated in FIG. 24.

FIG. 25 is an equivalent circuit of the TFT load type SRAM produced by the process described above, referring to FIGS. 15 through 23, and the same emblems as were employed in FIGS. 15 through 23 are employed also in FIG. 24.

Referring to FIG. 25, $Q_1$ and $Q_2$ indicate driver transistors, $Q_3$ and $Q_4$ indicate transfer gate transistors, $Q_5$ and $Q_6$ indicate load TFTs, WL indicates a word line, BL and /BL indicate bit lines, $S_1$ and $S_2$ indicate nodes, $V_{cc}$ indicates a positive power supply, and $V_{ss}$ indicates a negative power supply.

The function of the foregoing TFT load type SRAM will be described below.

The positive power supply $V_{cc}$ is selected to be 5 V, and the negative power supply $V_{ss}$ is selected to be 0 V. Supposing the voltage of the node $S_1$ is 5 V and the voltage of the node $S_2$ is 0 V, the transistor $Q_2$ is ON, the transistor $Q_6$ is OFF, the transistor $Q_1$ is OFF and the transistor $Q_5$ is ON. Provided the transistor $Q_1$ is OFF and the resistance thereof is sufficiently higher than that of the transistor $Q_5$ which is ON, the voltage of the node $S_1$ is kept at 5 V. On the other hand, provided the transistor $Q_2$ is ON and the resistance thereof is sufficiently less than that of the transistor $Q_6$ which is OFF, the voltage of the node $S_2$ is kept at 0 V.

Under the foregoing conditions, the resistance of the load transistors $Q_5$ and $Q_6$ varies following the memorized information. Therefore, a TFT load type SRAM is allowed to memorize information more stably than a high resistance load type SRAM. Since the channels of the load TFTs $Q_5$ and $Q_6$ are made of poly crystalline silicon layers and the crystal quality thereof is much worse than that of single crystalline silicon, however, the load TFTs $Q_5$ and $Q_6$ are inclined to allow leak current to flow, even under OFF condition. Since a leak current increases the power consumption of a memory chip, the TFTs are required to be made small in size.

FIG. 23 shows that the TFT load type SRAM described above has channels of the load TFTs below bit lines 22 made of the Al layers which is the top layer, remaining the insulator layers 21 including PSG layers therebetween.

This layer configuration allows the Al layers (the bit lines 22) to function as a gate electrode in combination with the insulator layer 21 which functions as a gate insulator layer, resultantly forming a parasitic transistor. Since the potential of the bit line 22 (the gate electrodes of the parasitic transistors) varies between 0 V ($V_{ss}$) and 5 V ($V_{cc}$), the transistors $Q_6$ which are to be OFF become almost ON, resultantly considerably increasing the leak current flowing therein.

For the purpose to remove this drawback, a double gate structure TFT load type SRAM was developed.

This double gate structure TFT load type SRAM has a fifth poly crystalline silicon layer which constitutes an upper gate electrode which have the same pattern as the third poly crystalline silicon layer namely the gate electrode 15 of the load TFT of the TFT load type SRAM described referring to FIGS. 15 through 25, the fifth poly crystalline silicon layer being arranged between the fourth poly crystalline silicon layer which constitutes the source region 17, the drain region, the channel region 19 etc. and the Al bit line 22, resultantly solving the problem.

FIGS. 26 through 28 are cross-sectional views of a semiconductor wafer illustrated for describing the process for producing a double gate structure TFT load type SRAM available in the prior art. The description for the process until the step in which the source region 17, the drain region 18, the channel region 19 of the TFT and the feeder of the $V_{cc}$ power supply is almost same as the description for the process for producing a TFT load type SRAM. Therefore, the following description will be limited to the steps which follow the foregoing steps.

Referring to FIG. 26, a CVD process is conducted to produce an $SiO_2$ layer 23 having a thickness of e.g. 500 Å. A RIE process is applied to the $SiO_2$ layer 23 to produce a contact hole 23A which reaches the fourth poly crystalline silicon layer or the drain region 18 of the TFT.

Referring to FIG. 27, a CVD process is conducted to produce a fifth poly crystalline silicon layer having a thickness of e.g. 1,000 Å. A thermal diffusion process is conducted to introduce phosphorus (n-type impurities) into the fifth poly crystalline Si layer. As a result, the fifth poly crystalline Si layer becomes to contain n-type impurities by e.g. $1 \times 10^{21}$ cm$^{-3}$. A RIE process is applied to the fifth poly crystalline Si layer to produce an upper gate electrode 24 of the TFT. A mixture of $CCl_4$ gas and $O_2$ gas is employed as the etching gas for this RIE process.

Referring to FIG. 28, a CVD process is conducted to produce an insulator layer 25 consisting of an $SiO_2$ layer having a thickness of e.g. 1,000 Å and a PSG layer having a thickness of e.g. 5,000 Å. A reflow process is conducted to make the surface of the PSG layer flat. A RIE process is applied to the insulator layer 25 to produce a contact hole for a bit line. For this RIE process, a resist mask is employed, and a mixture of $CHF_3$ and He is employed as the etching gas. A sputtering process is conducted to produce an Al layer having a thickness of 1 micrometer. A photolithography process is applied to the Al layer to produce a bit line 26.

The foregoing TFT load type SRAM or the foregoing double gate structure TFT load type SRAM is allowed to stably function with a small power consumption, when it is produced as is designed. The process for producing either of them is, however, involved with some steps difficult to conduct as are required, including the step for connecting the drain and the gate of a driving transistor.

FIGS. 29 through 32 illustrate cross-sectional views of a semiconductor wafer, the cross-sectional views being illustrated for describing the steps for connecting the drain and the gate of the driver transistor of an SRAM and for clarifying drawbacks inevitably accompanying the foregoing steps.

Referring to FIG. 29, a field insulator layer 2 and a gate insulator layer 3 are produced on a p$^-$-Si substrate 1 by conducting processes described above for the prior art. A photoresist layer 30 having an opening of the pattern for a contact hole. The contact hole 3A is produced by applying a wet etching process to the gate insulator layer 3, employing the photoresist mask 30. The photoresist layer 30 is removed by employing an $O_2$ plasma etching process. During this process, the surface of the Si substrate 1 is slightly oxidized.

Referring to FIG. 30, the thin $SiO_2$ layer produced during the $O_2$ plasma etching process is removed, before a first poly crystalline silicon layer 4a is produced by conducting a CVD process. A gaseous phase diffusion process is conducted to introduce phosphorus (n-type impurities) into the first poly crystalline silicon layer 4a and the selected area of the top region of the Si substrate 1. As a result, n$^+$-region 6A is produced.

Referring to FIG. 31, a RIE process in which a resist mask is employed is applied to the first poly crystalline silicon layer 4a to pattern it, and a gate electrode 4 is produced.

During this process, the surface of the Si substrate 1 is exposed, and a recess 1A unexpectedly turns out to be produced.

Referring to FIG. 32, an n$^+$-source region 5 (not shown) and an n$^+$-drain region 6 are produced by employing an ion implantation process, by which arsenic ions are introduced into the top surface of the Si substrate 1.

The foregoing description has clarified that the prior art process is involved with two drawbacks. The one is that since an SiO$_2$ layer unexpectedly produced during the O$_2$ plasma etching process conducted for removing the photoresist layer 30 must be removed by employing a wet etching process, the gate insulator layer 3 is damaged. Since the gate insulator layer 3 is thin, the dielectric strength thereof is decreased. The other is that a recess 1A is unexpectedly produced on a part of the top surface of the Si substrate 1 during the RIE process conducted to produce the gate electrode 4. If the recess 1A is deep, the resistance of the path connecting the drain region 6 and the gate electrode 4 becomes large.

It is known that a protection layer of a poly crystalline silicon layer arranged to cover a gate insulator layer 3 is effective to prevent the foregoing damage and the resultant decline in dielectric strength from occurring for the gate insulator layer 3.

FIGS. 33 through 35 are cross-sectional views of a semiconductor wafer illustrated for describing the other steps for connecting the drain and the gate of the driver transistor of an SRAM and for clarifying drawbacks inevitably accompanying the foregoing steps.

Referring to FIG. 33, a field insulator layer 2 and a gate insulator layer 3 are produced on a p$^-$-Si substrate 1 by conducting the process described above for the prior art. A protection layer 31 of a first poly crystalline silicon layer is produced on the gate insulator layer 3 by conducting a CVD process. A photoresist layer 30 has an opening of the pattern for a contact hole. A contact hole 3A is produced by conducting a RIE process conducted with assistance by the resist mask 30 and employing a mixture of CCl$_4$ and O$_2$ as the etching gas for Si and a wet etching process conducted employing hydrofluoric acid as the etchant for SiO$_2$.

Referring to FIG. 34, the photoresist layer 30 is removed by conducting an O$_2$ plasma etching process. During this process, the surface of the Si substrate 1 is slightly oxidized. The thin SiO$_2$ layer produced during the O$_2$ plasma etching process is removed by employing hydrofluoric acid, before a second poly crystalline silicon layer 4b is produced by conducting a CVD process. A gaseous phase diffusion process is conducted to introduce phosphorus (n-type impurities) into the second poly crystalline silicon layer 4b and the top region of the Si substrate 1. As a result, n$^+$-region 6A is produced.

Referring to FIG. 35, a RIE process in which a resist mask is employed is applied to the second poly crystalline silicon layer 4b and the protection layer 31 to pattern them, and a gate electrode 4 is produced.

During this process, the surface of the Si substrate 1 is exposed, and a recess 1A unexpectedly turns out to be produced. An n$^+$-source region (not shown) and an n$^+$-drain region 6 are produced by conducting an ion implantation process by which arsenic ions are introduced.

The foregoing description has clarified that the foregoing improved process wherein a protection layer 31 is arranged between the gate insulator layer 3 and the second poly crystalline silicon layer 4b, has removed a drawback wherein the gate insulator layer 3 is damaged by a wet etching process which is conducted to remove the thin SiO$_2$ layer which was unexpectedly produced during the O$_2$ plasma etching process which was inherently to remove the photoresist layer 30.

However, since the process for producing the gate electrode 4 is involved with two independent regions, one of which is the region from which both the first poly crystalline Si layer (the protection layer 31) and the second poly crystalline Si layer 4b are required to be removed and the other of which is the region from which the second poly crystalline Si layer 4b alone is required to be removed, the depth of the recess 1A becomes larger in the foregoing case described referring to FIGS. 33 through 35 than in the case described referring to FIGS. 29 through 32. Therefore, the resistance of the path connecting the drain region 6 and the gate electrode 4 becomes very large, and the path turns out discontinued by some chance. This is a serious drawback which can never be ignored.

Therefore, the first object of this invention is to provide a semiconductor device, wherein the dielectric strength of the gate insulator is not damaged during the production process thereof.

The second object of this invention is to provide a semiconductor device, wherein no recess is produced for the path connecting the drain region 6 and the gate electrode 4 during the production process thereof.

The third object of this invention is to provide a semiconductor device, wherein the dielectric strength of the gate insulator is not damaged and no recess is produced for the path connecting the drain region 6 and the gate electrode 4 during the production process thereof, the production process having less steps.

The fourth object of this invention is to provide a method for producing a semiconductor device, wherein the dielectric strength of the gate insulator is not damaged during the process.

The fifth object of this invention is to provide a method for producing a semiconductor device, wherein no recess is produced for the path connecting the drain region 6 and the gate electrode 4 during the process.

The sixth object of this invention is to provide a method for producing a semiconductor device, wherein the dielectric strength of the gate insulator is not damaged and no recess is produced for the path connecting the drain region 6 and the gate electrode 4 during the process.

SUMMARY OF THE INVENTION

The first and second objects of this invention can be achieved by a semiconductor device of this invention, which is provided with:

(a) a gate electrode (47) of a transistor, the gate electrode (47) being produced by patterning a first conductor layer (47a) produced by being piled on a gate insulator layer (43) of the transistor, (b) a drain region (49) of the transistor, the drain region (49) being produced by employing the gate electrode (47) of the transistor as part of a mask, and the drain region (49) being connected with a buried contact region (45) arranged under the gate insulator layer (43), and (c) a second conductor layer, the second conductor layer being produced by being piled on or over the gate electrode (47) of the transistor and the second conductor layer being connected with the buried contact region (45) through a contact hole produced in the gate insulator layer (43) of the transistor, at a location inside the buried contact region (45) and outside the drain region (49).

In the above semiconductor device, the first conductor layer can be the gate electrode (47) of the transistor, the first conductor layer working as a protection layer for the gate insulator layer in a process for producing the contact hole by exposing part of the buried contact region.

Further, in the semiconductor device, the gate electrode (47) of the transistor can be a laminate of the first and second conductor layers.

The first through third objects of this invention can be achieved by any of four semiconductor devices described below. First, the semiconductor device can achieve the first through third objects if it is further provided with:

(a) a first insulator layer (50) arranged between the gate electrode of a driver transistor, the gate electrode being made of the first conductor layer, and the second conductor layer, the first insulator layer having a contact hole having the same pattern as the contact hole and arranged at the same location as the contact hole, and (b) wherein the second conductor layer piled on the first insulator layer and connected with the buried contact region exposed in the contact hole is a gate electrode (51) of a load TFT.

Second, the semiconductor device can achieve the first through third objects if it is further provided with:

(a) a first insulator layer arranged between the gate electrode of a driver transistor, the gate electrode being made of the first conductor layer, and the second conductor layer, the first insulator layer having a contact hole having the same pattern as the contact hole and arranged at the same location as the contact hole, and (b) wherein the second conductor layer piled on the first insulator layer and connected with the buried contact region exposed in the contact hole is a resistor of a high resistance load.

Third, the semiconductor device can achieve the first through third objects if it is further provided with:

(a) a laminate of the first insulator layer, a gate electrode (52) of a load TFT and a gate insulator layer (53) of the load TFT, the laminate being piled in this order on the gate electrode of a driver transistor, the gate electrode being made of the first conductor layer, and (b) a drain region (54) of the load TFT connected with the side of a gate electrode of the load TFT, the side of the gate electrode of the driver transistor, and the top surface of the buried contact region, through a contact hole penetrating from the top layer consisting of the gate insulator layer of the load TFT to the bottom layer consisting of the gate electrode of the driver transistor.

Fourth, the semiconductor device can achieve the first through third objects if it is further provided with:

(a) a laminate of the first insulator layer, a lower gate electrode of a double gate structure TFT working as a load, (b) a lower gate insulator layer of the double gate structure TFT working as a load, a drain region of the double gate structure TFT working as a load, and an upper gate insulator layer of the double gate structure TFT working as a load, the laminate being piled in this order on the gate electrode of a driver transistor, the gate electrode consisting of the first conductor layer, and (c) an upper gate electrode (56) of the double gate structure TFT, the upper gate electrode (56) being connected with the side of a drain region of the double gate structure TFT, the side of a lower gate electrode of the double gate structure TFT, the side of a gate electrode of the driver transistor, and the top surface of the buried contact region, through a contact hole penetrating from the top layer consisting of the upper gate insulator layer of the double gate structure TFT to the bottom layer consisting of the gate electrode of the driver transistor.

The fourth and fifth objects of this invention can be achieved by a method for producing a semiconductor device, which comprises:

(a) a step for producing a gate insulator layer (43) of a transistor and a first conductor layer, after producing a field insulator layer (42) for isolation of ingredients, (b) a step for producing a buried contact region (45) by introducing impurities into a semiconductor substrate, (c) a step for exposing the side of the first conductor layer and the top surface of the buried contact region (45) by producing a contact hole in the first conductor layer and a gate insulator layer (43) of the transistor located under the first conductor layer, (d) a step for piling, on or over the first conductor layer, a second conductor layer connected, in the contact hole, with the side of the first conductor layer and the top surface of the buried contact region (45), (e) a step for producing a gate electrode (47) of the transistor and other electrodes and wires by patterning the first conductor layer, and (f) a step for producing a drain region of the transistor connected with the buried contact region (45) by introducing impurities in a semiconductor substrate, using the gate electrode (47) of the transistor and the patterned first and second conductor layers as a mask.

The fourth through sixth objects of this invention can be achieved by any of three methods for producing a semiconductor devices tabulated below. First, the method for producing a semiconductor device can achieve the fourth through sixth objects if it further comprises:

(a) a step for producing a gate electrode of a driver transistor by patterning the first conductor layer, after the buried contact region is produced, (b) a step for producing a drain region of the driver transistor, the drain region being connected with the buried contact region, by introducing impurities in a semiconductor substrate by employing the gate electrode of the driver transistor and the field insulator layer as a mask, (c) a step for producing an insulator layer on the gate electrode of the driver transistor, (d) a step for exposing the side of the gate electrode of the driver transistor and the top surface of the buried contact region by producing a contact hole penetrating the insulator layer, the gate electrode of the driver transistor and the gate insulator layer of the driver transistor, (e) a step for piling, on or over the insulator layer, a second conductor layer connected, in the contact hole, with the side of the gate electrode of the driver transistor and the top surface of the buried contact region, and (f) a step for producing a gate electrode of a load TFT by patterning the second conductor layer.

Second, the method for producing a semiconductor device can achieve the fourth through sixth objects if it further comprises:

(a) a step for producing a gate electrode of a driver transistor by patterning the first conductor layer, after producing the buried contact region, (b) a step for producing a drain region of the driver transistor, the drain region being connected with the buried contact region, by introducing impurities into a semiconductor substrate by employing the gate electrode of the driver transistor and the field insulator layer as a mask, (c) a step for producing an insulator layer and a second conductor layer, before producing a gate electrode of a TFT, by patterning the second conductor layer, (d) a step for piling a second insulator layer which is to be converted to a gate insulator layer (52) of the TFT, (e) a step for exposing the side of the gate electrode (52) of the TFT, the side of the gate electrode of the driver transistor and the top surface of the buried contact region, by producing a contact hole penetrating from the top layer consisting of the second insulator layer to the bottom layer consisting of the gate electrode of the driver transistor, (f) a step for piling, on the gate insulator layer (53) of the TFT, a third conductor layer connected, in the contact hole, with the side of the gate electrode (52) of the TFT, the side of the gate electrode of the driver transistor, and the top surface of the buried contact region, and (g) a step for producing a drain region of the TFT by patterning the third conductor layer.

Third, the method for producing a semiconductor can achieve the fourth through sixth objects if it further comprises:

(a) a step for piling a first insulator layer, a lower gate electrode of the TFT, a lower gate insulator layer of the TFT, a drain region of the TFT, and a second insulator layer in this order, after the drain region of the driver transistor is produced, (b) a step for exposing the side of the drain region of the TFT, the side of the lower gate electrode of the TFT, the side of the gate electrode of the driver transistor, and the top surface of the buried contact region, by producing a contact hole penetrating from the top layer consisting of the second insulator layer to the bottom layer consisting of the gate insulator layer of the driver transistor, (c) a step for piling, on the second insulator layer, a fourth conductor layer connected, in the contact hole, with the side of the drain region of the TFT, the side of the lower gate electrode of the TFT, the side of the gate electrode of the driver transistor, and the top surface of the buried contact region, and (d) a step for producing an upper gate electrode of the TFT by patterning the fourth conductor layer.

Any of the preceding four methods may further comprises:

(a) a step for producing the gate insulator layer of the transistor or the driver transistor, after a field insulator layer is produced for isolation, and (b) a step for producing the first conductor layer, after the buried contact region is produced by introducing impurities through the gate insulator layer of the driver transistor.

Any of the first four methods may alternatively further comprises:

(a) a step for producing the buried contact layer by introducing impurities, after the field insulator layer is produced for isolation, and (b) a step for producing the gate insulator layer of the transistor or the driver transistor and the first conductor layer in this order.

BRIEF DESCRIPTION OF THE DRAWINGS

FIG. 20 is a cross-sectional view of a semiconductor wafer illustrated for describing the process for producing a TFT load type SRAM available in the prior art, FIG. 21 is a cross-sectional view of a semiconductor wafer illustrated for describing the process for producing a TFT load type SRAM available in the prior art.

DETAILED DESCRIPTION OF THE PREFERRED EMBODIMENTS

Figure 1:
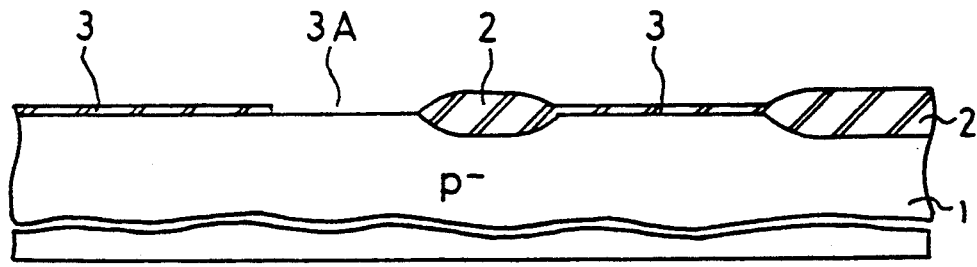
FIG. 1 is a cross-sectional view of a semiconductor wafer illustrated for describing the process for producing a high resistance load type SRAM available in the prior art.
Figure 2:
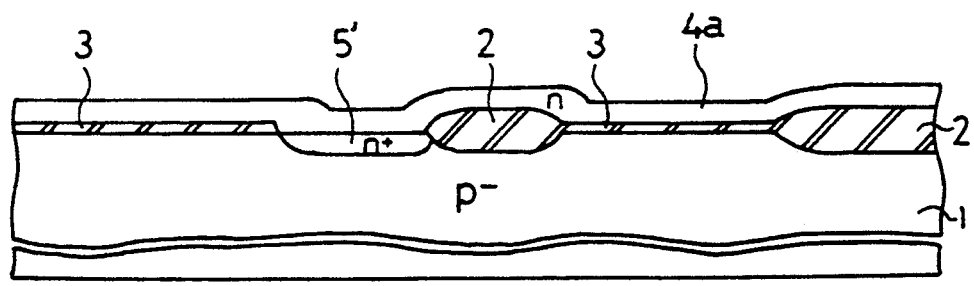
FIG. 2 is a cross-sectional view of a semiconductor wafer illustrated for describing the process for producing a high resistance load type SRAM available in the prior art.
Figure 3:
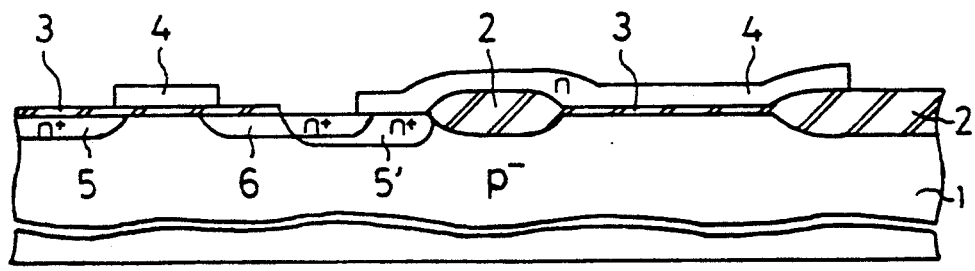
FIG. 3 is a cross-sectional view of a semiconductor wafer illustrated for describing the process for producing a high resistance load type SRAM available in the prior art.
Figure 4:
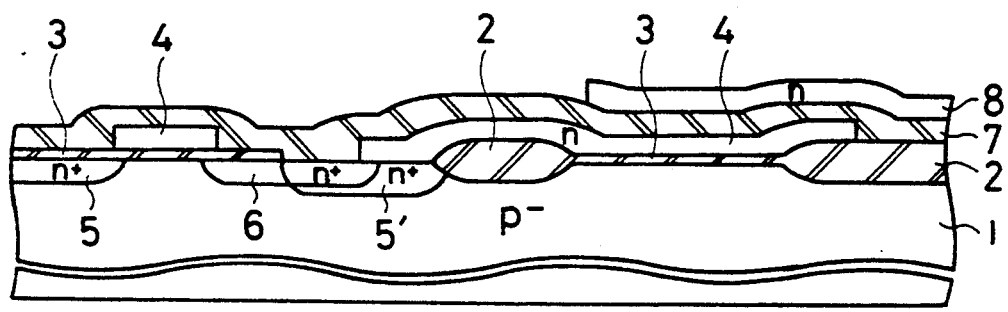
FIG. 4 is a cross-sectional view of a semiconductor wafer illustrated for describing the process for producing a high resistance load type SRAM available in the prior art.
Figure 5:
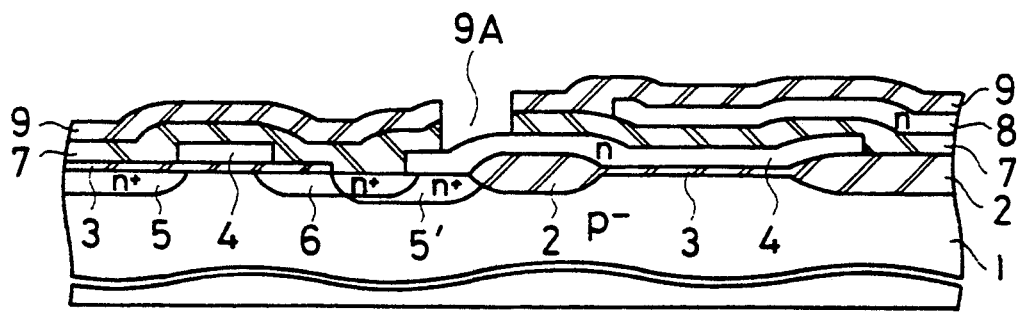
FIG. 5 is a cross-sectional view of a semiconductor wafer illustrated for describing the process for producing a high resistance load type SRAM available in the prior art.
Figure 6:
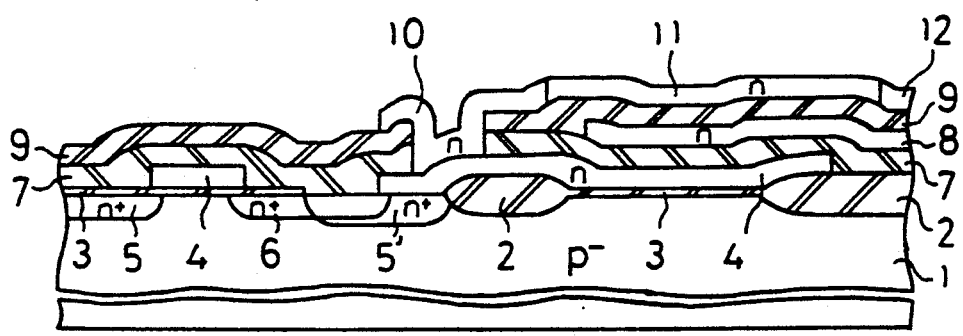
FIG. 6 is a cross-sectional view of a semiconductor wafer illustrated for describing the process for producing a high resistance load type SRAM available in the prior art.
Figure 7:
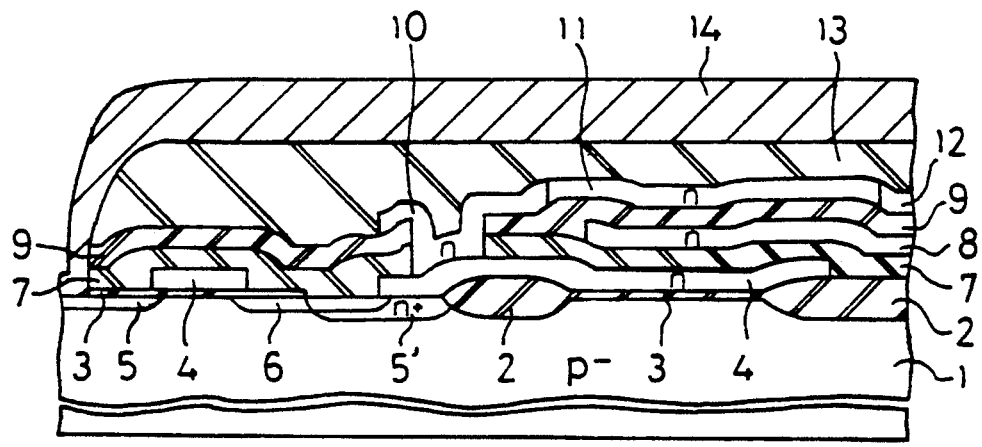
FIG. 7 is a cross-sectional view of a semiconductor wafer illustrated for describing the process for producing a high resistance load type SRAM available in the prior art.
Figure 8:
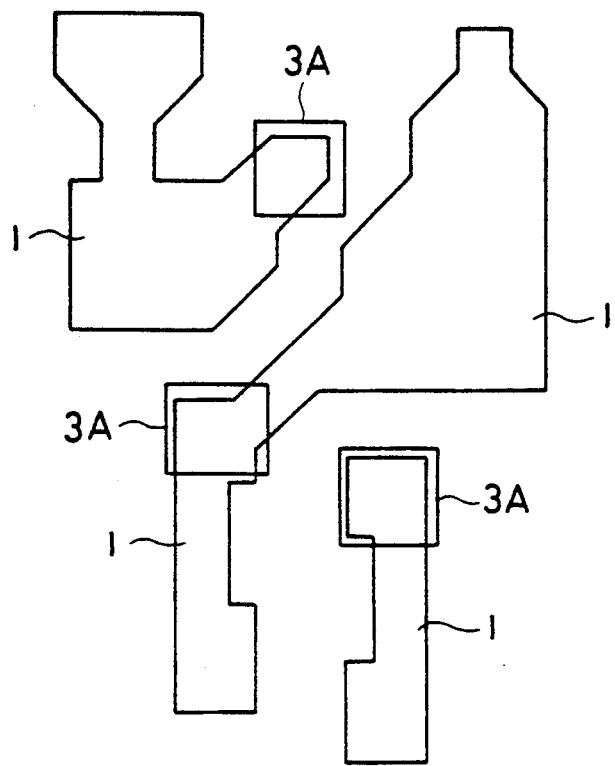
FIG. 8 is a plan view of a semiconductor wafer illustrated for describing the process for producing a high resistance load type SRAM available in the prior art.
Figure 9:
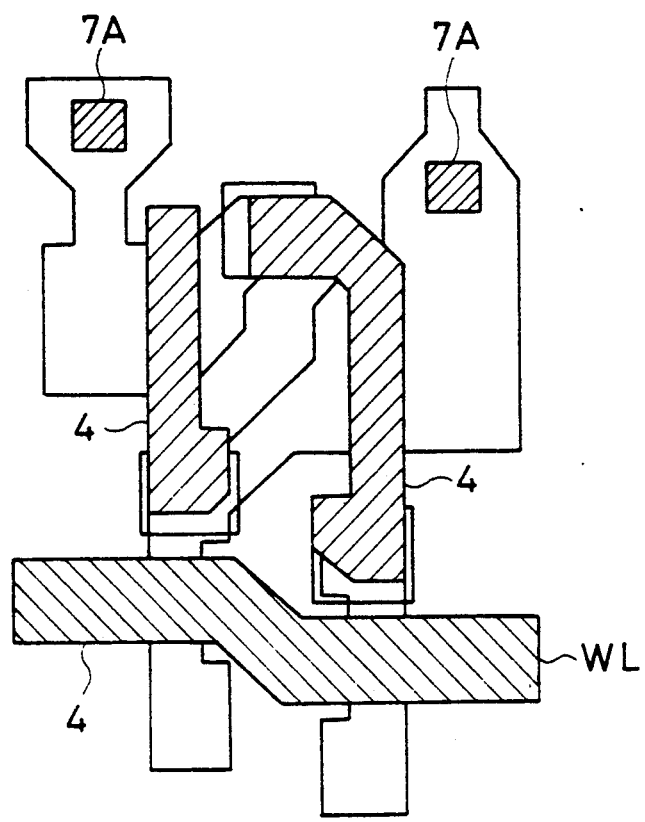
FIG. 9 is a plan view of a semiconductor wafer illustrated for describing the process for producing a high resistance load type SRAM available in the prior art.
Figure 10:
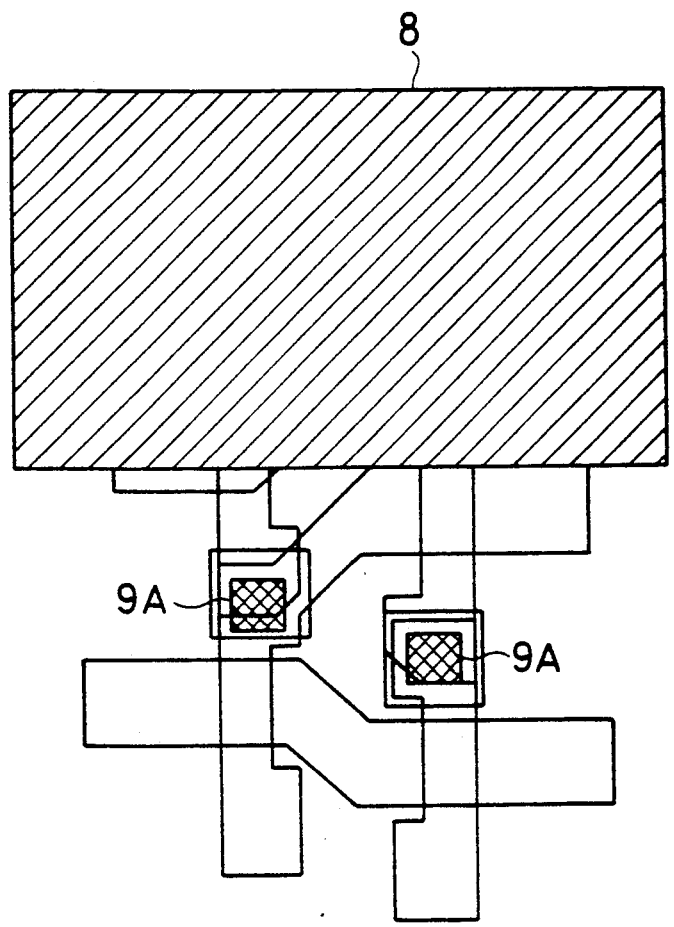
FIG. 10 is a plan view of a semiconductor wafer illustrated for describing the process for producing a high resistance load type SRAM available in the prior art.
Figure 11:
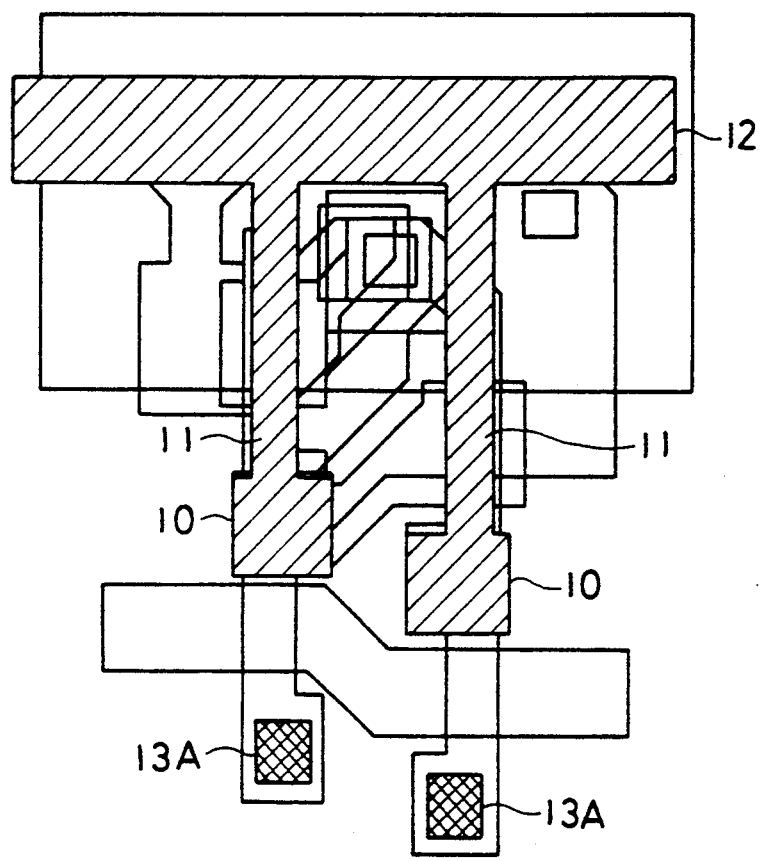
FIG. 11 is a plan view of a semiconductor wafer illustrated for describing the process for producing a high resistance load type SRAM available in the prior art.
Figure 12:
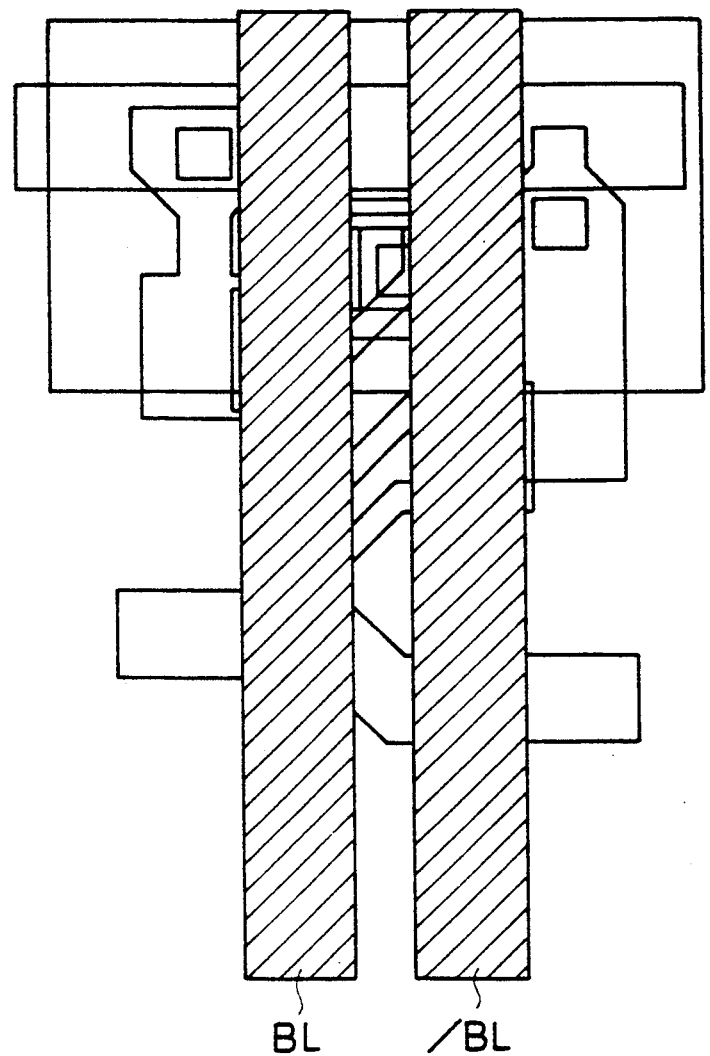
FIG. 12 is a plan view of a semiconductor wafer illustrated for describing the process for producing a high resistance load type SRAM available in the prior art.
Figure 13:
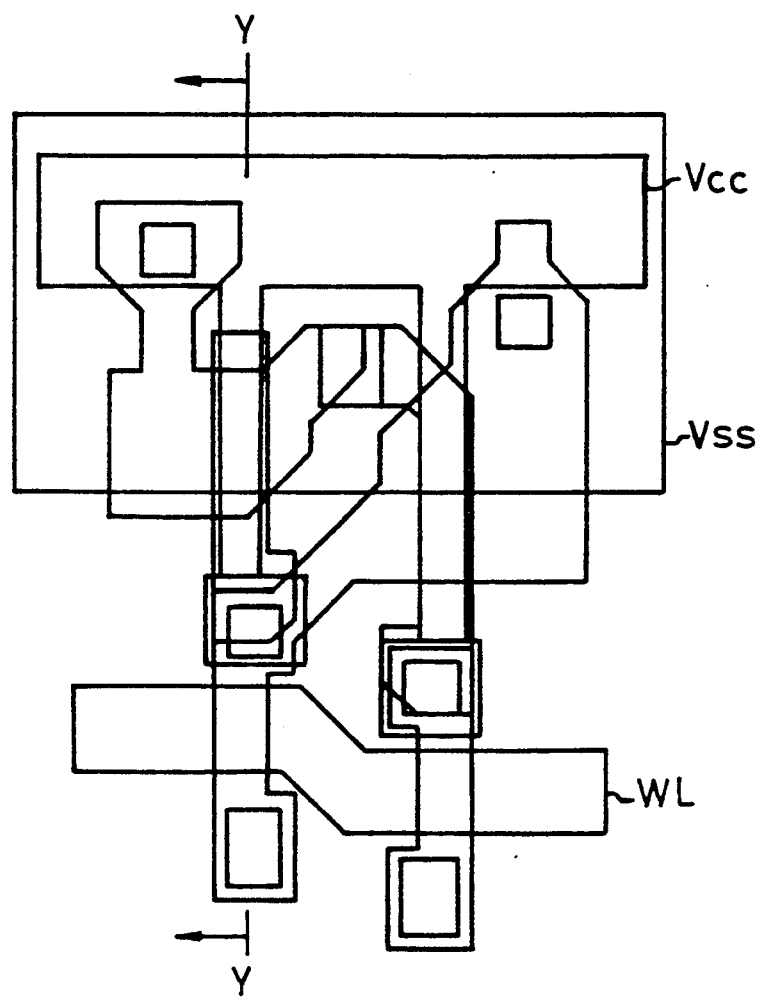
FIG. 13 is a plan view of a semiconductor wafer illustrated for describing the process for producing a high resistance load type SRAM available in the prior art.
Figure 14:
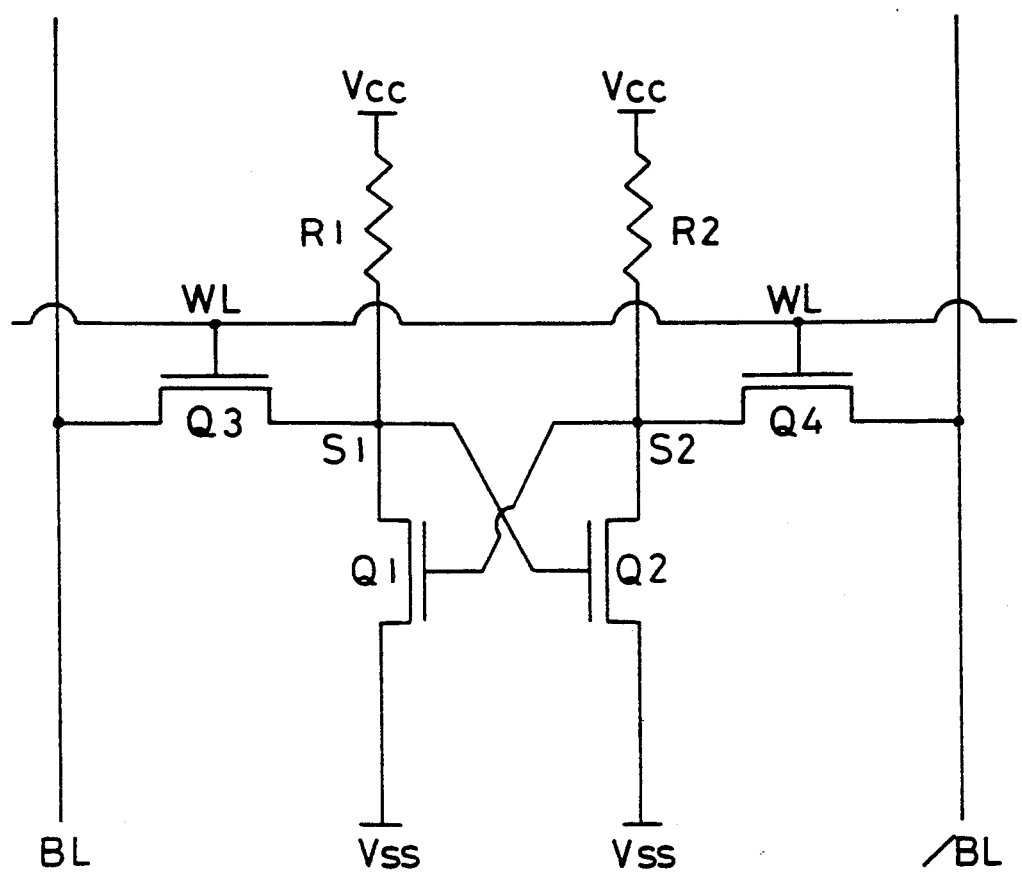
FIG. 14 is an equivalent circuit of a high resistance load type SRAM available in the prior art.
Figure 15:
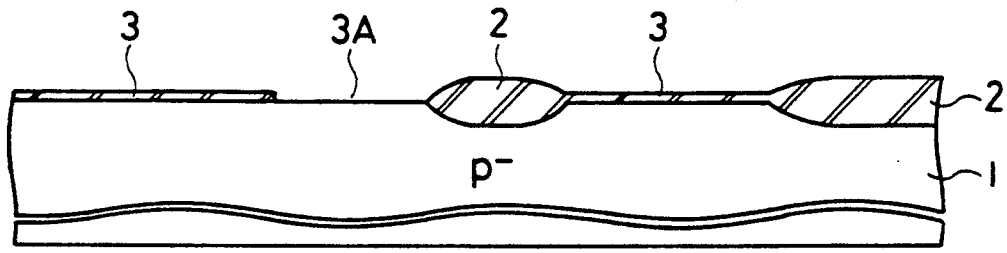
FIG. 15 is a cross-sectional view of a semiconductor wafer illustrated for describing the process for producing a TFT load type SRAM available in the prior art.
Figure 16:
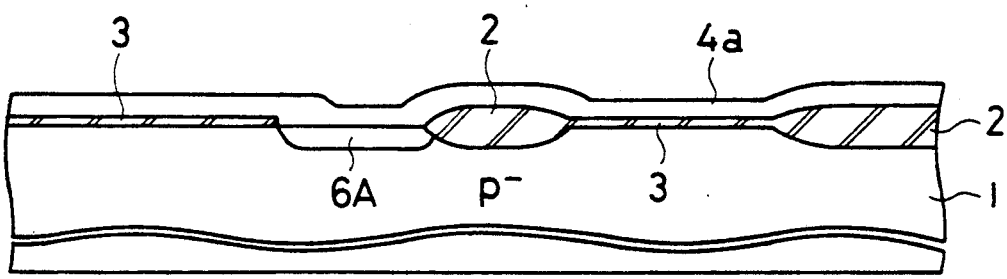
FIG. 16 is a cross-sectional view of a semiconductor wafer illustrated for describing the process for producing a TFT load type SRAM available in the prior art.
Figure 17:
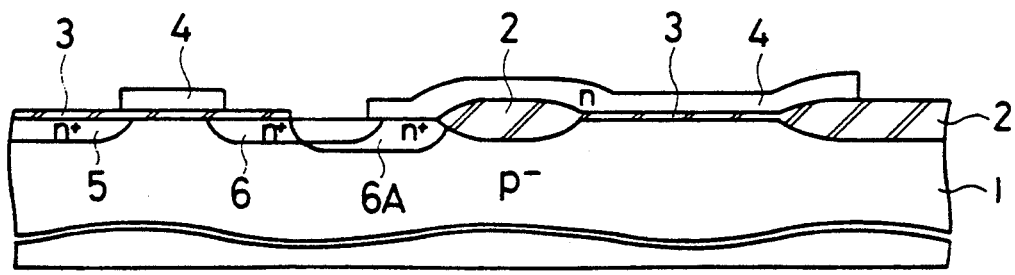
FIG. 17 is a cross-sectional view of a semiconductor wafer illustrated for describing the process for producing a TFT load type SRAM available in the prior art.
Figure 18:
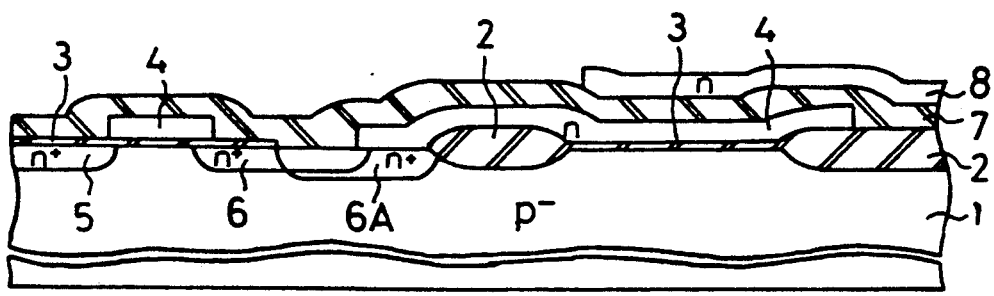
FIG. 18 is a cross-sectional view of a semiconductor wafer illustrated for describing the process for producing a TFT load type SRAM available in the prior art.
Figure 19:
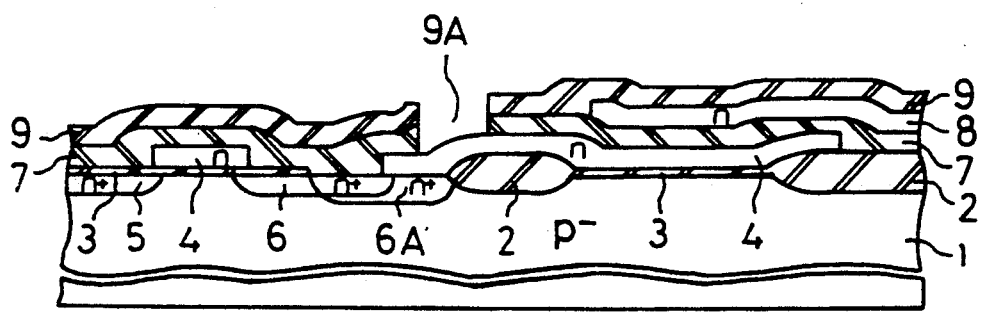
FIG. 19 is a cross-sectional view of a semiconductor wafer illustrated for describing the process for producing a TFT load type SRAM available in the prior art.
Figure 22:
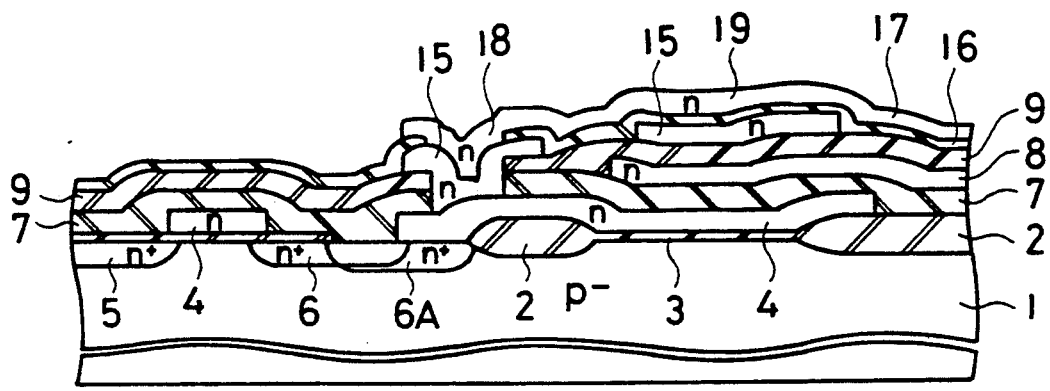
FIG. 22 is a cross-sectional view of a semiconductor wafer illustrated for describing the process for producing a TFT load type SRAM available in the prior art.
Figure 23:
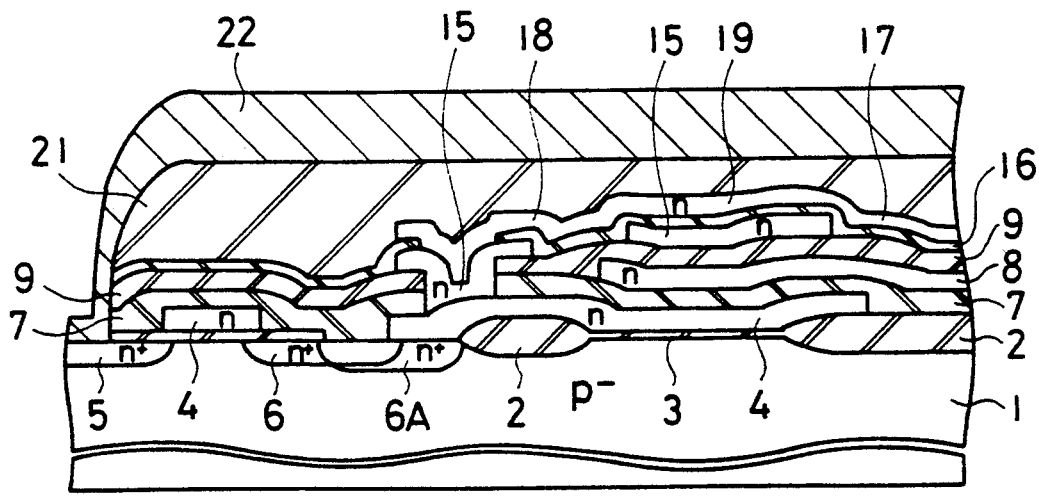
FIG. 23 is a cross-sectional view of a semiconductor wafer illustrated for describing the process for producing a TFT load type SRAM available in the prior art.
Figure 24:
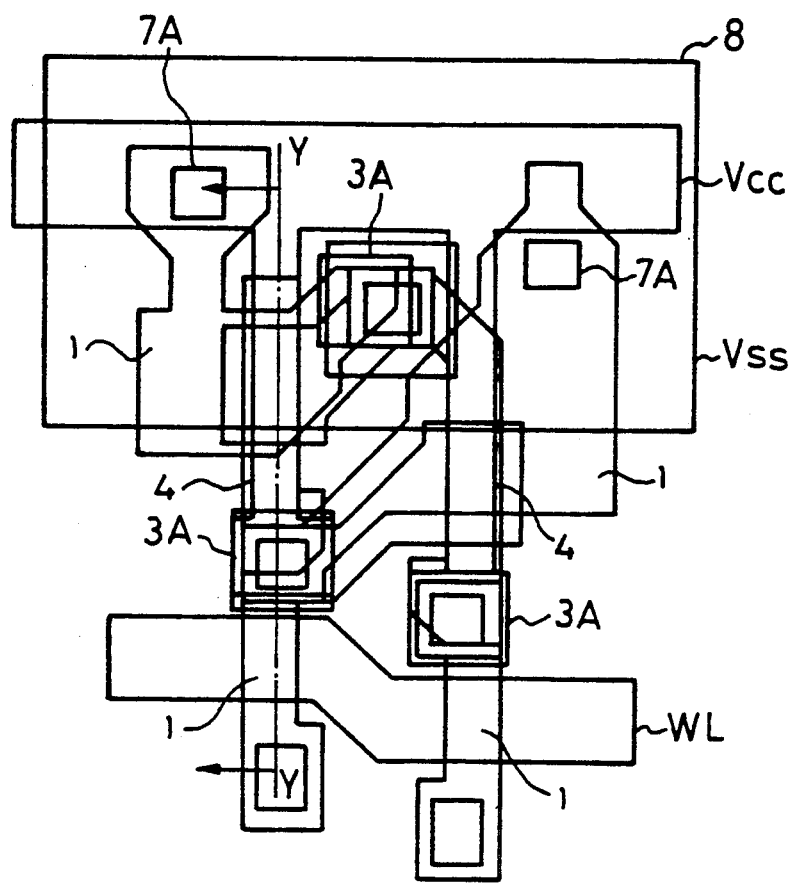
FIG. 24 is a plan view of a semiconductor wafer illustrated for describing the process for producing a TFT load type SRAM available in the prior art.
Figure 25:
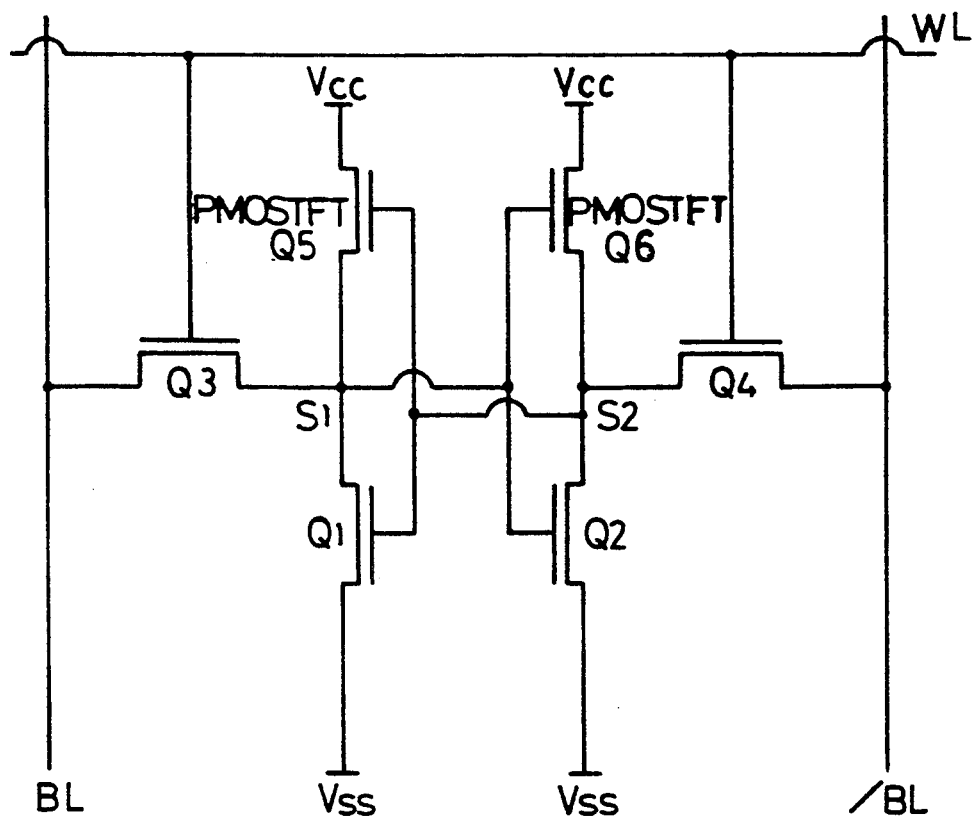
FIG. 25 is an equivalent circuit of a TFT load type SRAM available in the prior art.
Figure 26:
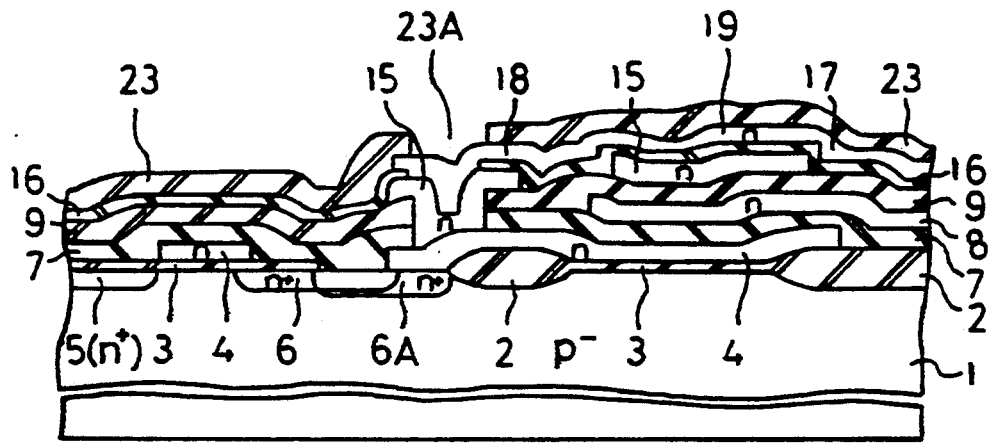
FIG. 26 is a cross-sectional view of a semiconductor wafer illustrated for describing the process for producing a double gate structure TFT load type SRAM available in the prior art.
Figure 27:
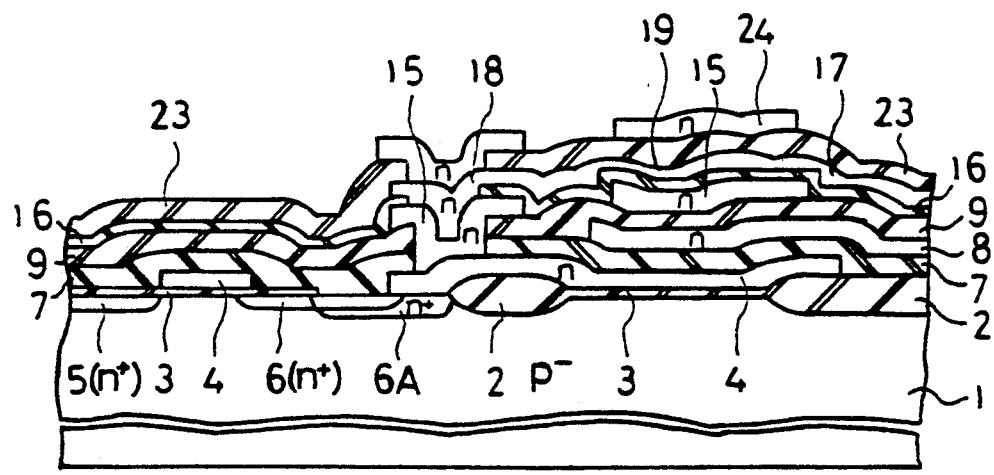
FIG. 27 is a cross-sectional view of a semiconductor wafer illustrated for describing the process for producing a double gate structure TFT load type SRAM available in the prior art.
Figure 28:
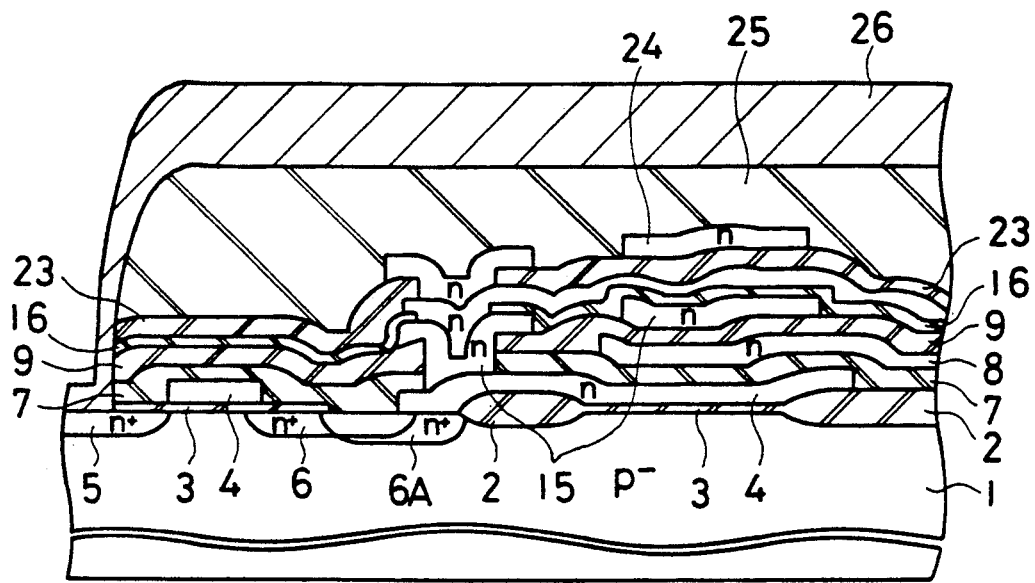
FIG. 28 is a cross-sectional view of a semiconductor wafer illustrated for describing the process for producing a double gate structure TFT load type SRAM available in the prior art.
Figure 29:
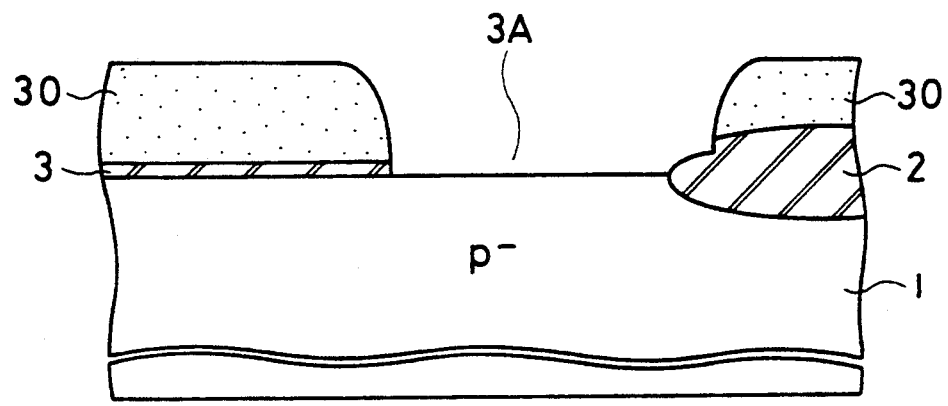
FIG. 29 is a cross-sectional view of a semiconductor wafer illustrated for describing the steps for connecting the drain and the gate of the driver transistor of an SRAM available in the prior art.
Figure 30:
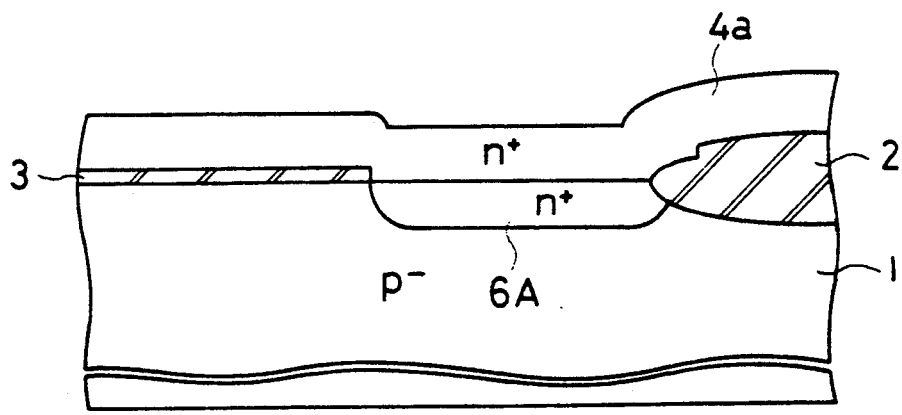
FIG. 30 is a cross-sectional view of a semiconductor wafer illustrated for describing the steps for connecting the drain and the gate of the driver transistor of an SRAM available in the prior art.
Figure 31:
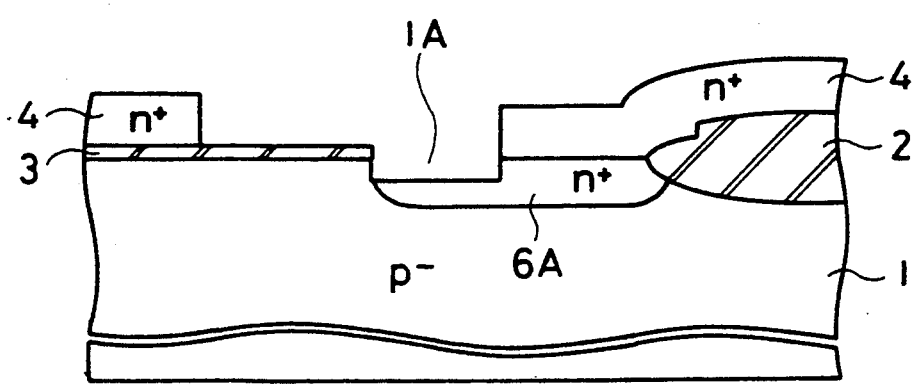
FIG. 31 is a cross-sectional view of a semiconductor wafer illustrated for describing the steps for connecting the drain and the gate of the driver transistor of an SRAM available in the prior art.
Figure 32:
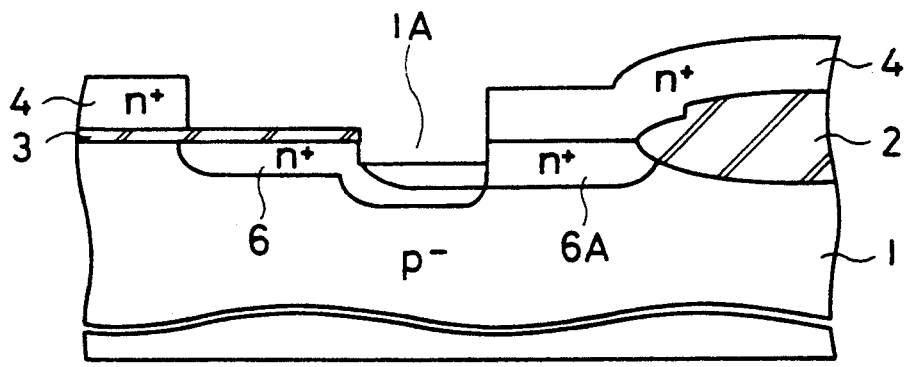
FIG. 32 is a cross-sectional view of a semiconductor wafer illustrated for describing the steps for connecting the drain and the gate of the driver transistor of an SRAM available in the prior art.
Figure 33:
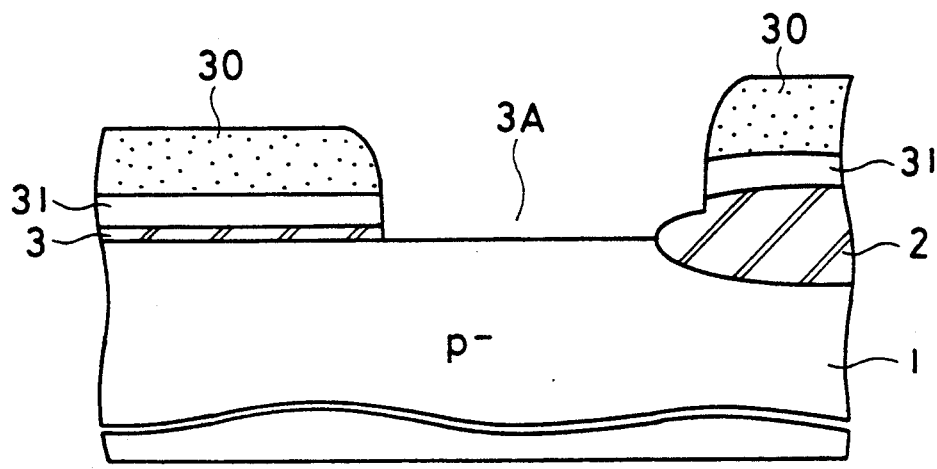
FIG. 33 is a cross-sectional view of a semiconductor wafer illustrated for describing the other steps for connecting the drain and the gate of the driver transistor of an SRAM available in the prior art.
Figure 34:
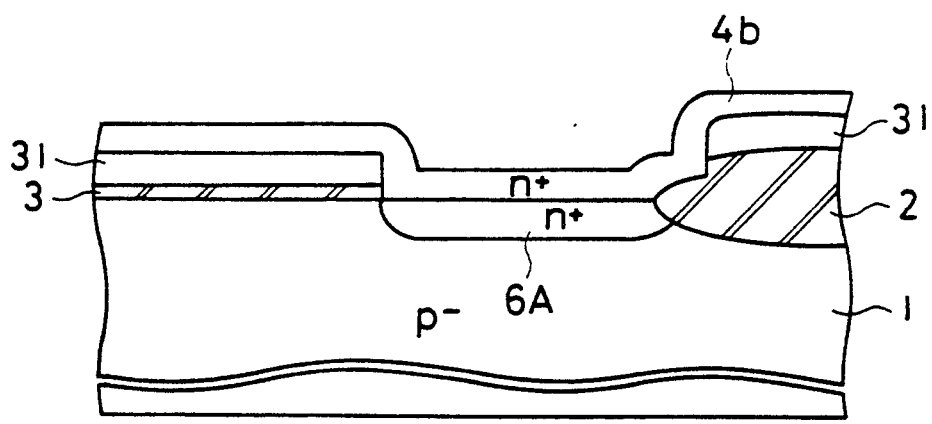
FIG. 34 is a cross-sectional view of a semiconductor wafer illustrated for describing the other steps for connecting the drain and the gate of the driver transistor of an SRAM available in the prior art.
Figure 35:
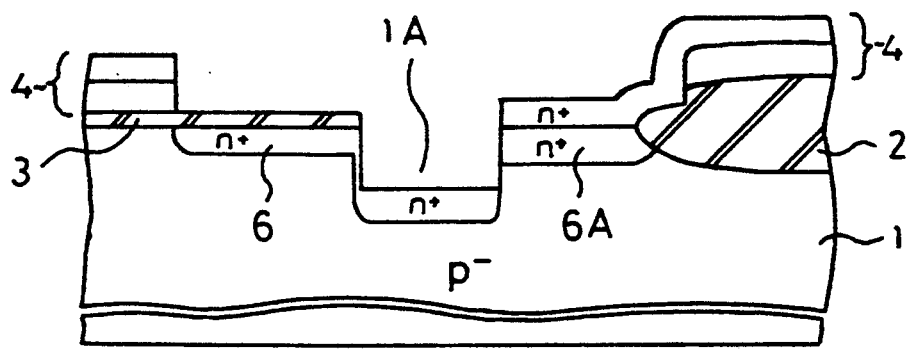
FIG. 35 is a cross-sectional view of a semiconductor wafer illustrated for describing the other steps for connecting the drain and the gate of the driver transistor of an SRAM available in the prior art.

Referring to the drawings, processes for producing SRAMs in accordance with seven independent embodiments of this invention will be presented below.

The drawings will be illustrated for the cross section illustrated in FIGS. 29 through 35 which are limited portions of FIGS. 15 through 28. Therefore, the configuration of the semiconductor wafer other than is illustrated in the following drawings will be entirely identical to that of the prior art described earlier.

FIRST EMBODIMENT

FIGS. 36 through 39 are cross-sectional views of a semiconductor wafer illustrated for describing a TFT load type SRAM in accordance with the first embodiment of this invention.

Figure 36:
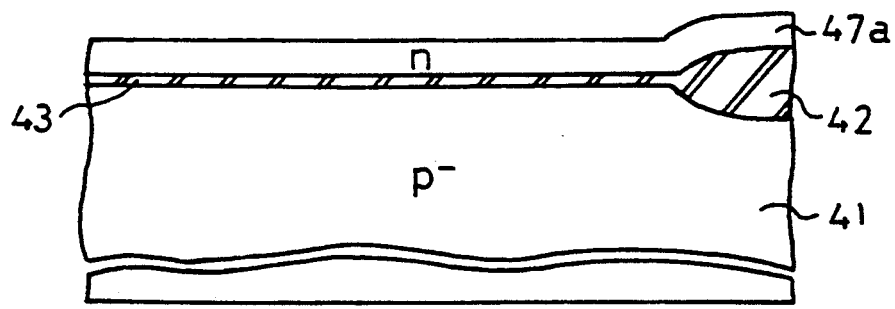
FIG. 36 is a cross-sectional view of a semiconductor wafer illustrated for describing a TFT load type SRAM in accordance with the first embodiment of this invention.

Referring to FIG. 36, a LOCOS process is conducted to produce a field insulator layer 42 of an $SiO_2$ layer having a thickness of e.g. 4,000 Å on a $p^-$-Si substrate 41. A mask employed for the LOCOS process is removed, and the surface of the Si substrate 41 is exposed. The surface of the Si substrate 41 is oxidized to produce a gate insulator layer 43. A CVD process is conducted to produce a first poly crystalline silicon layer 47a having a thickness of e.g. 500 Å and containing n-type impurities. This first poly crystalline silicon layer 47a is scheduled to be a part of the gate electrode of a driver transistor, after it is patterned. Incidentally, this first poly crystalline silicon layer 47a is scheduled to act as a protection layer for the gate insulator layer 43.

Figure 37:
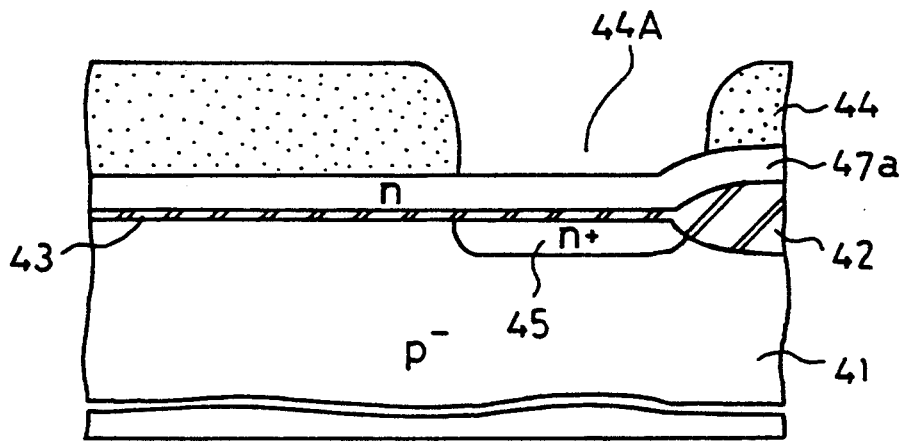
FIG. 37 is a cross-sectional view of a semiconductor wafer illustrated for describing a TFT load type SRAM in accordance with the first embodiment of this invention.

Referring to FIG. 37, a photoresist layer 44 having an opening 44A which is to be employed for producing a buried contact region is produced. An $n^+$-region 45 which is a buried region is produced by conducting an ion implantation process conducted by employing a photoresist mask 44 having an opening 44A. A preferable dosage is for example $1 \times 10^{15}$ cm$^{-2}$ and a preferable acceleration energy is for example 150 KeV.

Figure 38:
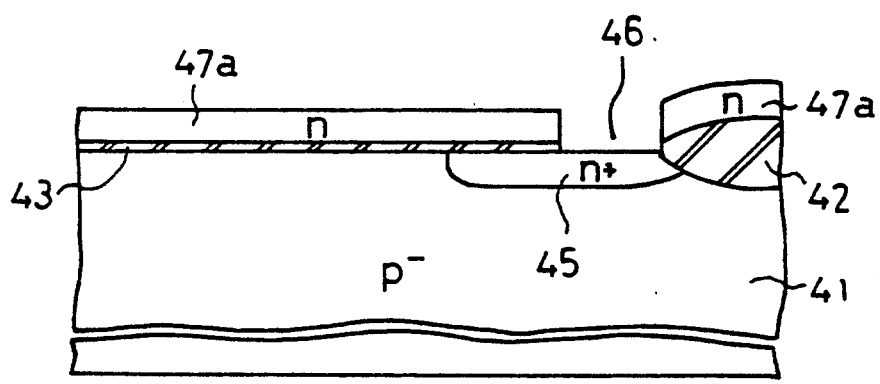
FIG. 38 is a cross-sectional view of a semiconductor wafer illustrated for describing a TFT load type SRAM in accordance with the first embodiment of this invention.

Referring to FIG. 38, the photoresist mask 44 is removed by conducting an $O_2$ plasma etching process. In this process, the surface of the first poly crystalline silicon layer 47a is slightly oxidized. However, this is no problem, because the oxide layer will be readily removed in the next step. The first poly crystalline silicon layer 47a and the gate insulator layer 43 are removed from a selected area corresponding to a limited part of the $n^+$region 45 for the purpose to produce a contact hole 46. Employed for this step are a photoresist mask (not shown) and a RIE process employing a mixture of $CCl_4$ gas and $O_2$ gas as the etchant for silicon layer 47a and a RIE process employing a mixture of $CHF_3$ gas and He gas as the etchant for $SiO_2$ layer 43.

Figure 39:
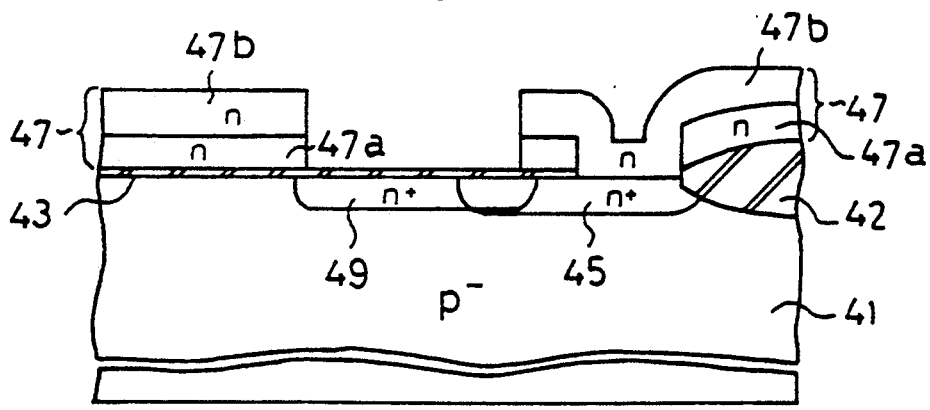
FIG. 39 is a cross-sectional view of a semiconductor wafer illustrated for describing a TFT load type SRAM in accordance with the first embodiment of this invention.

Referring to FIG. 39, a CVD process is conducted to produce a second poly crystalline silicon layer 47b having a thickness of e.g. 500 Å and containing n-type impurities after removing the oxide layer unexpectedly produced. The first poly crystalline silicon layer acts as a protection layer and therefore the gate insulator layer 43 incurs no damage. A gate electrode 47 is produced by selectively etching the second poly crystalline silicon layer 47b and the first poly crystalline silicon layer 47a. For this etching process, a photoresist mask (not shown) and a RIE etching process employing a mixture of $CCl_4$ and $O_2$ as the etching gas. An $n^+$-source region (not shown) and an $n^+$-drain region 49 are produced by introducing arsenic (n-impurities) by conducting an ion implantation process for which the gate electrode 47 and the field insulator layer 42 are employed as the mask. The preferable dosage is $1 \times 10^{15}$ cm$^{-2}$ and the preferable acceleration energy is 50 KeV. The drawing shows that the $n^+$-region 45 which contacts with the gate electrode 47 of a driver transistor is connected with the $n^+$-drain region 49 of the driver transistor, resultantly the gate electrode 47 of the driver transistor being connected with the $n^+$-drain region 49 of the driver transistor.

As was described above, since the gate insulator layer 43 is protected by the first poly silicon layer 47a in the step for producing the second poly silicon layer 47b which is connected with the silicon substrate 41, the gate insulator layer 43 is not damaged in this step, and there are no recess region produced by this embodiment such as mentioned in the prior art, although one mask step is increased in comparison with the prior art.

SECOND EMBODIMENT

FIGS. 40 through 43 are cross-sectional views of a semiconductor wafer illustrated for describing a TFT load type SRAM in accordance with the second embodiment of this invention.

Figure 40:
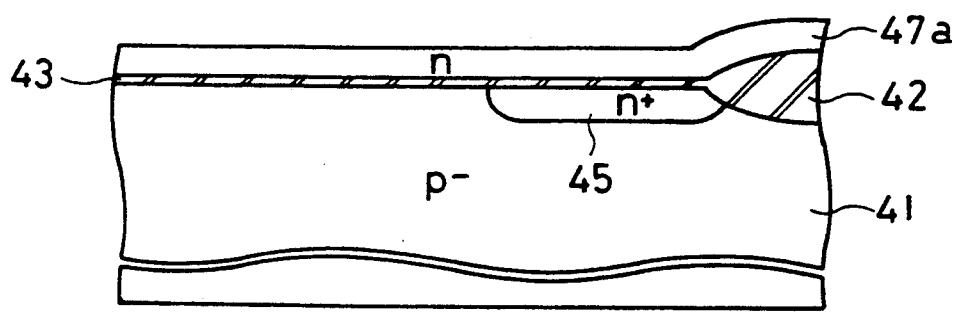
FIG. 40 is a cross-sectional view of a semiconductor wafer illustrated for describing a TFT load type SRAM in accordance with the second embodiment of this invention.

Referring to FIG. 40, a field insulator layer 42, a gate insulator layer 43 and a doped first poly crystalline silicon layer 47a and an $n^+$-region 45 are produced on a silicon substrate 41 by conducting the same steps as were conducted for the first embodiment.

Figure 41:
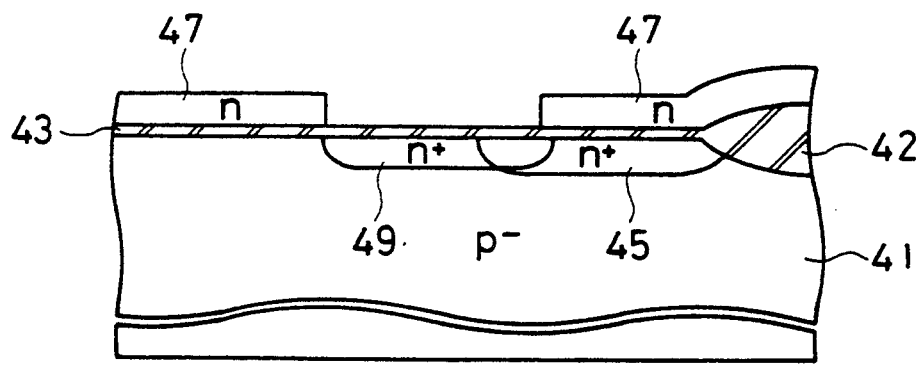
FIG. 41 is a cross-sectional view of a semiconductor wafer illustrated for describing a TFT load type SRAM in accordance with the second embodiment of this invention.

Referring to FIG. 41, a gate electrode 47 is produced by selectively patterning the first poly crystalline silicon layer 47a by conducting a RIE process conducted with the assistance of a resist mask (not shown) and employing a mixture of HBr gas and He gas as the etching gas. An $n^+$-source region (not shown) and an $n^+$-drain region 49 are produced by introducing As ions into the silicon substrate 41 by conducting an ion implantation process conducted with the dosage of e.g. $1 \times 10^{15}$ cm$^{-2}$ and the acceleration energy of e.g. 50 KeV and by employing the gate electrode 47 and the field insulator layer 42 as the masks.

In this embodiment, the $n^+$-region 45 which contacts with the gate electrode 47 is connected with the $n^+$-drain region 49, and the $n^+$-drain region 49 of the driver transistor is connected with the gate electrode 47, in this early stage.

Figure 42:
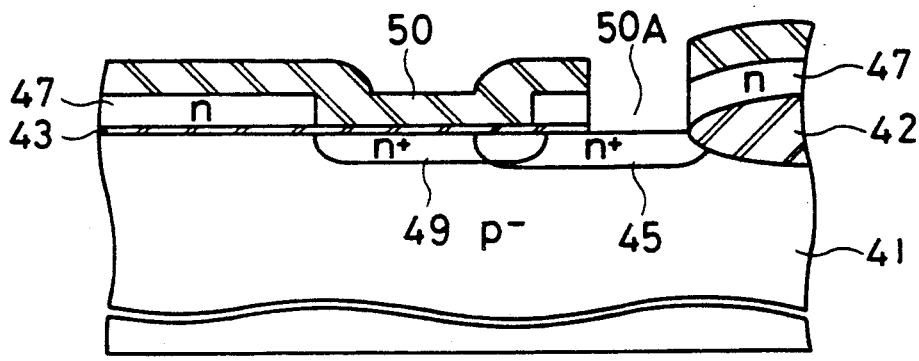
FIG. 42 is a cross-sectional view of a semiconductor wafer illustrated for describing a TFT load type SRAM in accordance with the second embodiment of this invention.

Referring to FIG. 42, an insulator layer 50 of an $SiO_2$ layer having a thickness of e.g. 1,000 Å is produced by conducting a CVD process. A contact hole 50A is produced in the insulator layer 50, the gate electrode 47, and the gate insulator layer 43 by conducting a RIE process conducted employing a mixture of $CHF_3$ gas and He gas as the etching gas for $SiO_2$ and a mixture of HBr gas and He gas as the etching gas for Si and by assistance of a resist mask (not shown).

Figure 43:
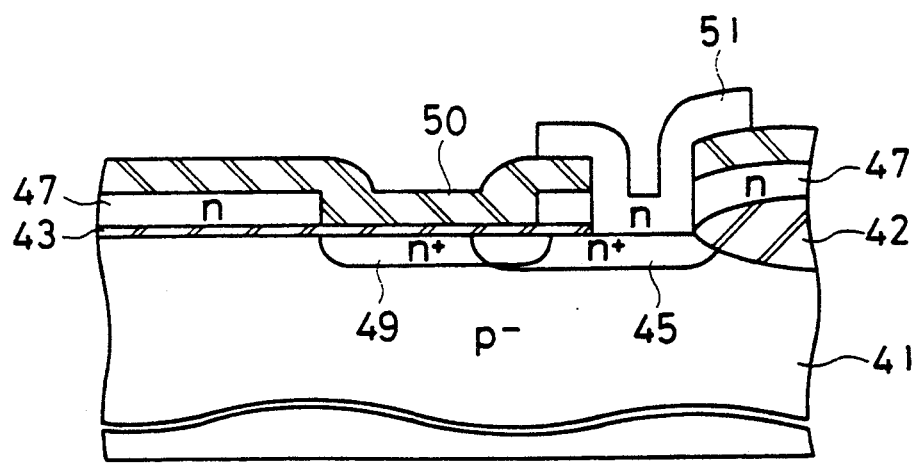
FIG. 43 is a cross-sectional view of a semiconductor wafer illustrated for describing a TFT load type SRAM in accordance with the second embodiment of this invention.

Referring to FIG. 43, a second n-doped poly crystalline silicon layer having a thickness of e.g. 500 Å is produced by conducting a CVD process. Since the second poly crystalline silicon layer buries the contact hole 50A, it contacts with the side of the gate electrode 47 of the driver transistor and with the top surface of the n+-region 45. The gate electrode 51 of a TFT is produced by patterning the second poly crystalline silicon layer by conducting a RIE process conducted employing a mixture of HBr gas and He gas as the etching gas and by assistance of a resist mask (not shown).

Accordingly, the second embodiment is involved with advantages wherein no damage is produced for the gate insulator layer 43 with no recessed portion mentioned in the prior art, and no increase is required for the quantity of mask steps, because the layer corresponding to the first poly crystalline silicon layer produced to protect the gate insulator layer 43 in the first embodiment is the gate electrode of the driver transistor of an SRAM for which a driver transistor is inherently essential in the second embodiment. This embodiment is allowed to be applied also for a high resistance type SRAM, in which case the gate electrode 51 of a TFT works as a high resistance.

THIRD EMBODIMENT

FIGS. 44 through 47 are cross sectional views of a semiconductor wafer illustrated for describing a double gate structure TFT type SRAM in accordance with the third embodiment of this invention.

Figure 44:
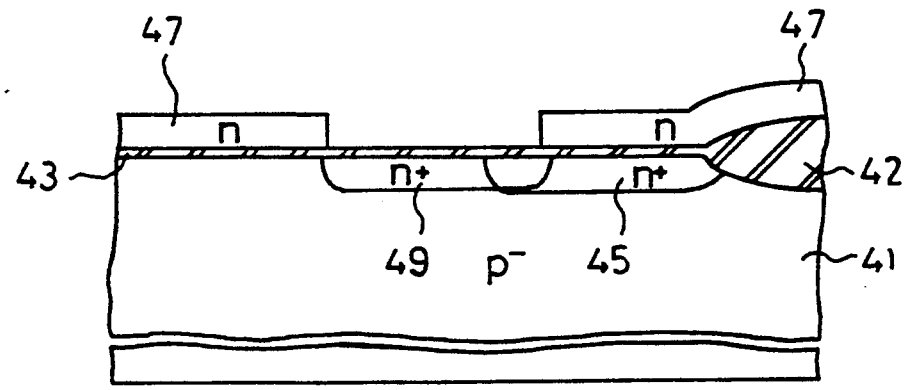
FIG. 44 is a cross-sectional view of a semiconductor wafer illustrated for describing a double gate structure TFT type SRAM in accordance with the third embodiment of this invention.

Referring to FIG. 44, a field insulator layer 42, a gate insulator layer 43, a gate electrode 47 of a driver transistor, an n+-region 45, an n+-source region (not shown) and an n+-drain region 49 are produced on a silicon substrate 41 by conducting the same steps as were conducted for the first embodiment.

Figure 45:
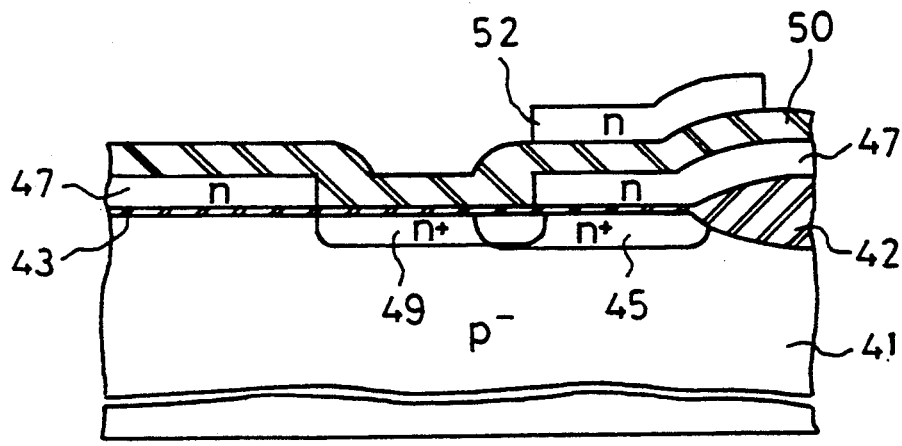
FIG. 45 is a cross-sectional view of a semiconductor wafer illustrated for describing a double gate structure TFT type SRAM in accordance with the third embodiment of this invention.

Referring to FIG. 45, an $SiO_2$ layer 50 having a thickness of e.g. 1,000 Å is produced by conducting a CVD process. After a second poly crystalline silicon layer having a thickness of e.g. 500 Å is produced by conducting a CVD process, n-type impurities are introduced therein by $1 \times 10^{21}$ cm$^{-3}$ by conducting a thermal diffusion process. Thereafter, a lower gate electrode 52 of a double gate structure TFT by patterning the second poly crystalline silicon layer by conducting a RIE process conducted with assistance by a resist mask and by employing a mixture of $CCl_4$ gas and $O_2$ gas as an etching gas.

Figure 46:
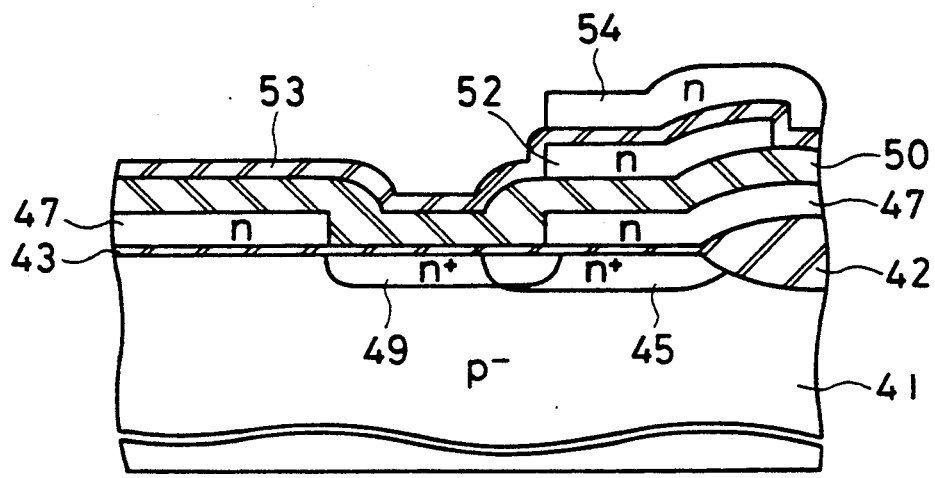
FIG. 46 is a cross-sectional view of a semiconductor wafer illustrated for describing a double gate structure TFT type SRAM in accordance with the third embodiment of this invention.

Referring to FIG. 46, a lower gate insulator layer 53 of the double gate structure TFT is produced by conducting a CVD process, the insulator layer 53 being an $SiO_2$ layer having a thickness of e.g. 200 Å. After a third poly crystalline silicon layer having a thickness of e.g. 500 Å is produced by conducting a CVD process, boron ions (p-impurities) are introduced in the regions thereof which is scheduled to be converted to a source region and a drain region of the double gate structure type TFT, by conducting an ion implantation process conducted with assistance by a resist mask and with a dosage of e.g. $1 \times 10^{14}$ cm$^{-2}$ and an acceleration energy of e.g. 5 KeV. The source region (not shown), the drain region 54, a channel region (not shown), and a $V_{cc}$ power supply feeder (not shown) of the double gate structure TFT are produced by patterning the third poly crystalline silicon layer by conducting a RIE process conducted with assistance by a resist mask and by employing a mixture of $CCl_4$ gas and $O_2$ gas as the etching gas.

Figure 47:
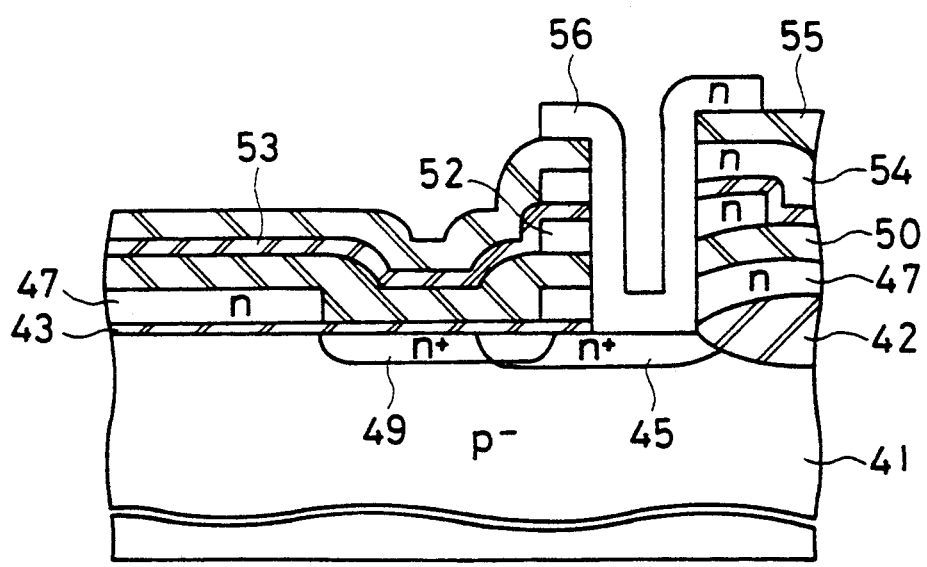
FIG. 47 is a cross-sectional view of a semiconductor wafer illustrated for describing a double gate structure TFT type SRAM in accordance with the third embodiment of this invention.

Referring to FIG. 47, an upper gate insulator layer 55 of the double gate structure TFT, the insulator layer being an $SiO_2$ layer having a thickness of e.g. 500 Å, is produced by conducting a CVD process. A contact hole is produced by applying a selective etching process to the upper gate insulator layer 55 of the double gate structure TFT, the drain region 54 of the double gate structure TFT, the lower gate insulator layer 53 of the double gate structure TFT, the lower gate electrode 52 of the double gate structure TFT, the insulator layer 50 of an $SiO_2$ layer, and the gate electrode 47 of the driver transistor and the gate insulator layer 43 of an $SiO_2$ layer, the selective etching process being conducted with assistance by a resist mask and by employing a RIE process conducted by employing a mixture of $CHF_3$ gas and He gas for $SiO_2$ and a mixture of HBr gas and He gas for Si. A fourth poly crystalline silicon layer having a thickness of e.g. 500 Å is produced by conducting a CVD process. Phosphorus (n-type impurities) is introduced in the fourth poly crystalline silicon layer by a density of $1 \times 10^{21}$ cm$^{-3}$, by conducting a thermal diffusion process. An upper gate electrode 56 of the double gate structure TFT and the like are produced by patterning the fourth poly crystalline silicon layer with assistance by a resist mask and by employing a RIE process employing a mixture of HBr gas and He gas as the etching gas.

Referring to FIG. 47, the upper gate electrode 56 contacts, in the contact hole, with the side of the drain region 54 of the double gate structure TFT, the side of the lower gate electrode 52 of the double gate structure TFT, the side of the gate electrode 47 of the driver transistor, and the top surface of the n+-region 45, resultantly connecting all of them with the drain region 49 of the driver transistor.

As was described above, the connection between the driver transistor and the double gate structure TFT is realized for the third embodiment by allowing the upper gate electrode 56 of the double gate structure TFT to penetrate from the top layer to the bottom layer. As a result, the gate insulator layer 43 incurs no damages, and the quantity of the mask steps for this embodiment is less than that of the ordinary process for producing a double gate structure TFT type SRAM by two steps.

Although the first through third embodiments employs an ion implantation process penetrating the first poly crystalline silicon layer which is to be converted to the gate electrode 47 of a driver transistor, when n+-region 45 which is employed for connection, other embodiments featuring in other means for connecting of the n+-region 45 will be described below.

FOURTH EMBODIMENT

Figure 48:
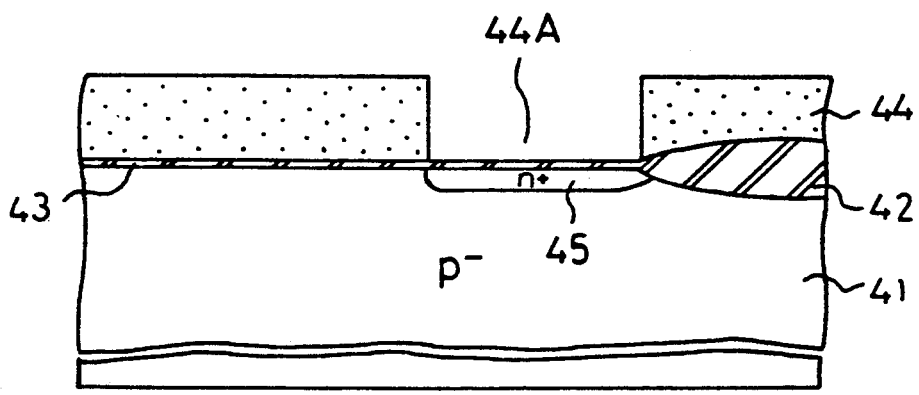
FIG. 48 is a cross-sectional view of a semiconductor wafer illustrated for describing an SRAM in accordance with the fourth embodiment of this invention.
Figure 49:
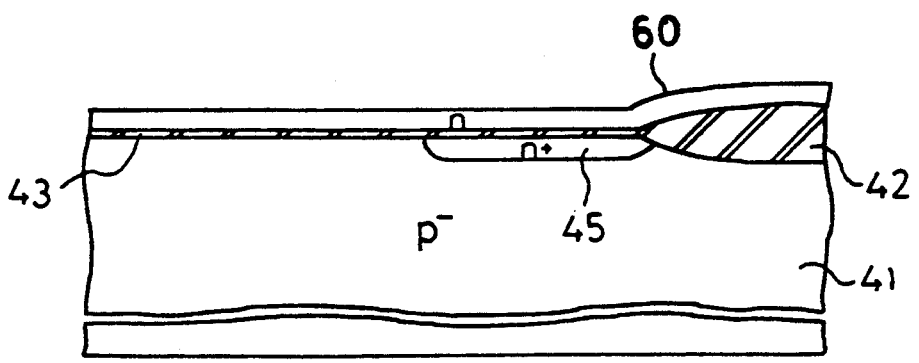
FIG. 49 is a cross-sectional view of a semiconductor wafer illustrated for describing an SRAM in accordance with the fourth embodiment of this invention.

FIGS. 48 and 49 are cross-sectional views of a semiconductor wafer illustrated for describing an SRAM in accordance with the fourth embodiment of this invention.

Referring to FIG. 48, a field insulator layer 42 and a gate insulator layer 43 are produced on a silicon substrate 41 by conducting the same steps as were conducted for the first through third embodiments. A photoresist layer 44 having an opening 44A at a location where an n+-region 45 is scheduled to be produced, is produced. An n+-region 45 which is a buried contact region is produced by introducing arsenic ions (n-type ions) in the top surface of the silicon substrate 41 with assistance by the resist mask 44 and by employing an ion implantation process conducted with the dosage of e.g. $1 \times 10^{15}$ cm$^{-2}$ and the acceleration energy of e.g. 30 KeV.

Referring to FIG. 49, the photoresist mask 44 is removed by conducting an O$_2$ plasma etching process. A first n-doped poly crystalline silicon layer 60 having a thickness of e.g. 500 Å is produced by conducting a CVD process.

Thereafter, the same steps as were employed for the first through third embodiments are conducted to finish the process.

In the fourth embodiment, after the photoresist layer 44 is produced on the gate insulator layer 43, the opening 44A is produced by patterning the photoresist layer 44. Since the gate insulator layer 43 is damaged in this step, the process of the fourth embodiment remains a drawback to be removed.

FIFTH EMBODIMENT

Figure 50:
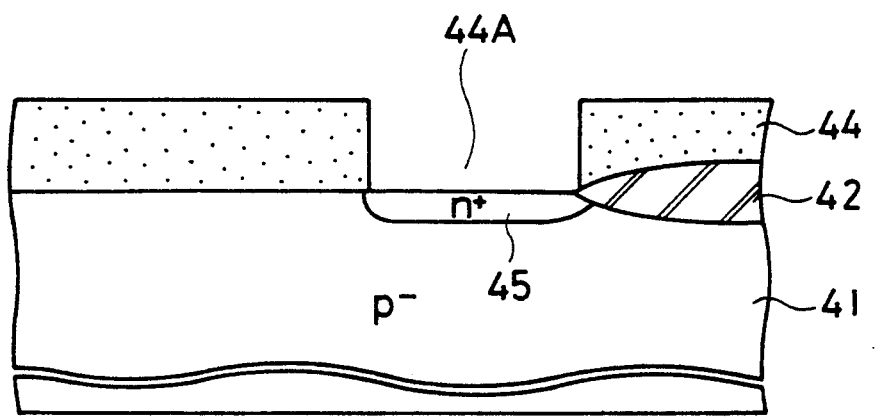
FIG. 50 is a cross-sectional view of a semiconductor wafer illustrated for describing an SRAM in accordance with the fifth embodiment of this invention.
Figure 51:
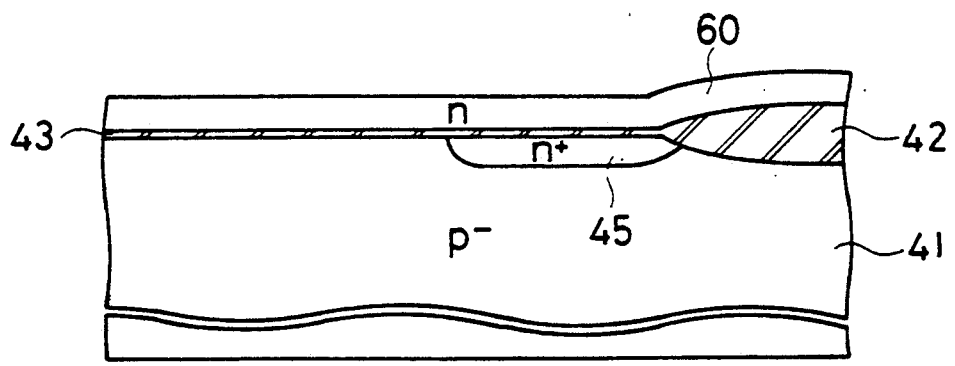
FIG. 51 is a cross-sectional view of a semiconductor wafer illustrated for describing an SRAM in accordance with the fifth embodiment of this invention.

FIGS. 50 and 51 are cross-sectional views of a semiconductor wafer illustrated for describing an SRAM in accordance with the fifth embodiment of this invention.

Referring to FIG. 50, a field insulator layer 42 is produced on a silicon substrate 41 by employing the same steps as were employed for the first through fourth embodiments. A photoresist layer 44 having an opening 44A at a location where an n+-region 45 is scheduled to be produced, is produced. An n+-region 45 which is a buried contact region is produced by introducing arsenic ions (n-type impurities) in the top surface of the silicon substrate 41 with assistance by the resist mask 44 and by employing an ion implantation process conducted with the dosage of e.g. $1 \times 10^{15}$ cm$^{-2}$ and the acceleration energy of e.g. 30 KeV.

Referring to FIG. 51, photoresist mask 44 is removed by employing an O$_2$ plasma etching process. A gate insulator layer 43 of an SiO$_2$ layer having a thickness of e.g. 100 Å is produced by oxidizing the surface of the silicon substrate 41. A first n-doped poly crystalline silicon layer 60 having a thickness of e.g. 500 Å is produced by conducting a CVD process.

Thereafter, the same steps as were employed for the first through third embodiments are conducted to finish the process.

In the fifth embodiments, if the gate insulator layer 43 is produced at a high temperature, the quality of the gate insulator layer 43 becomes good. However, since this high temperature causes additional diffusion of arsenic diffused in the n+-region 45, a high temperature process is not desirable to keep the shape of the n+-region 45.

As was described above, since the fourth and fifth embodiments are involved with drawbacks, these are inferior to the first through third embodiments. However, if the process conditions are well selected, these processes can be practical.

SIXTH EMBODIMENT

FIGS. 52 through 55 are cross-sectional views of a semiconductor wafer illustrated for describing a high resistance load type SRAM in accordance with the sixth embodiment of this invention.

Figure 52:
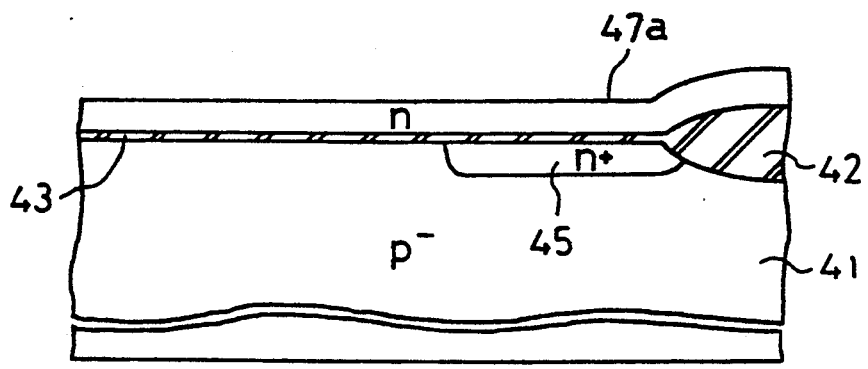
FIG. 52 is a cross-sectional view of a semiconductor wafer illustrated for describing a high resistance load type SRAM in accordance with the sixth embodiment of this invention.

Referring to FIG. 52, a field insulator layer 42 of an SiO$_2$ layer having a thickness of e.g. 4,000 Å is produced on a silicon substrate 41 by employing a LOCOS process. An Si$_3$N$_4$ mask employed for the LOCOS process is removed. A gate insulator layer 43 of an SiO$_2$ layer having a thickness of e.g. 100 Å is produced by oxidizing the top surface of the silicon substrate 41. A first n-doped poly crystalline silicon layer 47a having a thickness of e.g. 500 Å is produced by employing a CVD process. This first poly crystalline silicon layer 47a is scheduled to be a part of the gate electrode of a driver transistor, after being patterned. Incidentally, it will work as a protector for the gate insulator layer 43. A photoresist layer (not shown) having an opening at a location where a buried contact region is scheduled to be produced, is produced. An n+-region 45 which is a buried contact region is produced by introducing arsenic ions (n-type impurities) by employing an ion implantation process conducted with assistance by a resist mask and with the dosage of e.g. $1 \times 10^{15}$ cm$^{-2}$ and the acceleration energy of e.g. 150 KeV.

Figure 53:
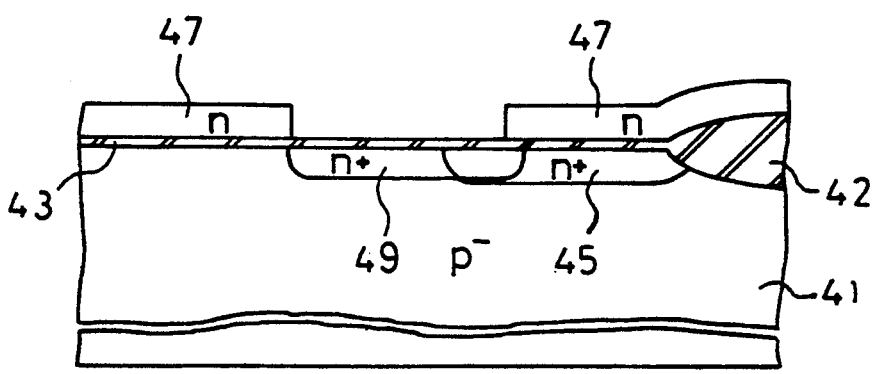
FIG. 53 is a cross-sectional view of a semiconductor wafer illustrated for describing a high resistance load type SRAM in accordance with the sixth embodiment of this invention.

Referring to FIG. 53, a gate electrode 47 is produced by patterning the first poly crystalline silicon layer 47a with assistance by a resist mask and by employing a RIE process conducted employing a mixture of HBr gas and He gas as an etching gas. An n+-source region (not shown) and an n+-drain region 49 are produced by introducing arsenic ions (n-type impurities) in the top surface of the silicon substrate 41 by employing an ion implantation process conducted employing the gate electrode 47 and the field insulator layer 42 as masks and conducted with the dosage of e.g. $1 \times 10^{15}$ cm$^{-2}$ and the acceleration energy of e.g. 50 KeV.

Figure 54:
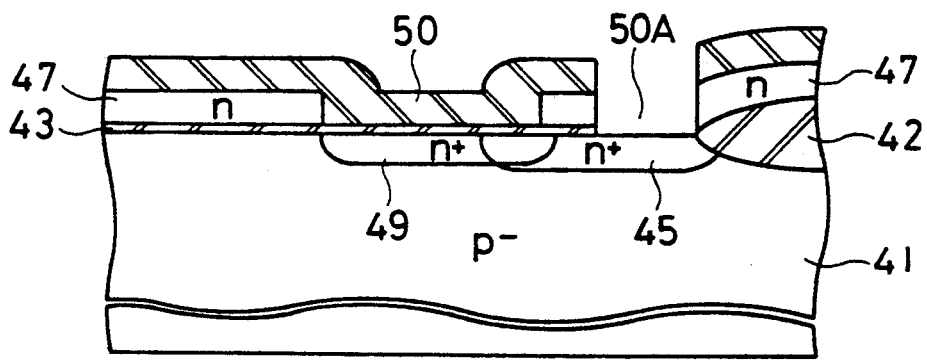
FIG. 54 is a cross-sectional view of a semiconductor wafer illustrated for describing a high resistance load type SRAM in accordance with the sixth embodiment of this invention.

Referring to FIG. 54, an insulator layer 50 of an SiO$_2$ layer having a thickness of e.g. 1,000 Å is produced by employing a CVD process. A contact hole 50A is produced by applying a selective etching process to the insulator layer 50 of SiO$_2$ and the gate electrode 47 of the driver transistor made of the first poly crystalline silicon layer by employing a RIE process conducted employing a mixture of CHF$_3$ gas and He gas as the etching gas for SiO$_2$ and a mixture of HBr gas and He gas as the etching gas for Si.

Figure 55:
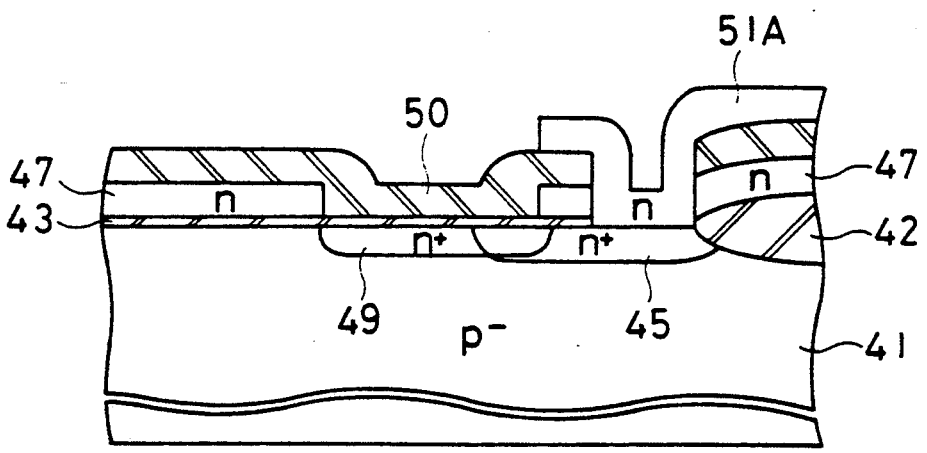
FIG. 55 is a cross-sectional view of a semiconductor wafer illustrated for describing a high resistance load type SRAM in accordance with the sixth embodiment of this invention.

Referring to FIG. 55, a second un-doped poly crystalline silicon layer having a thickness of e.g. 500 Å is produced by employing a CVD process. A mask process and an ion implantation process are employed to convert the portions of a V$_{cc}$ line and a contact region of the un-doped poly crystalline silicon layer to n-type conductivity. During these processes, n-type impurities are not introduced to the high resistance region. This second poly crystalline silicon layer contacts, in the contact hole 50A, with the side of the gate electrode 47 of a driver transistor and with the top surface of the n+-region 45. A high resistance load 51A is produced by patterning the second poly crystalline silicon layer by employing a RIE process conducted with assistance by a resist mask and employing a mixture of HBr gas and He gas as the etching gas.

The sixth embodiment has advantages wherein the gate insulator layer 43 is not damaged, and the quantity of the mask processes does not increase, because the equivalent to the first poly crystalline silicon layer 47a produced as a protector for the gate insulator layer in the first embodiment is allowed to work also as the gate electrode of a driver transistor essential for an SRAM.

SEVENTH EMBODIMENT

Figure 56:
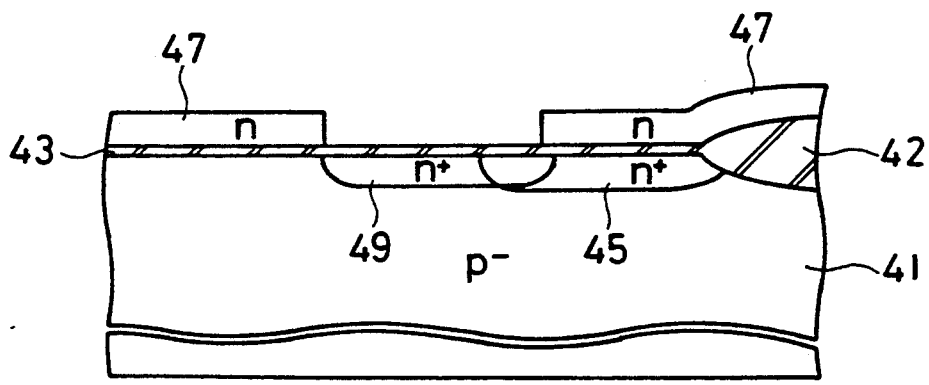
FIG. 56 is a cross-sectional view of a semiconductor wafer illustrated for describing a double gate structure TFT load type SRAM in accordance with the seventh embodiment of this invention.
Figure 57:
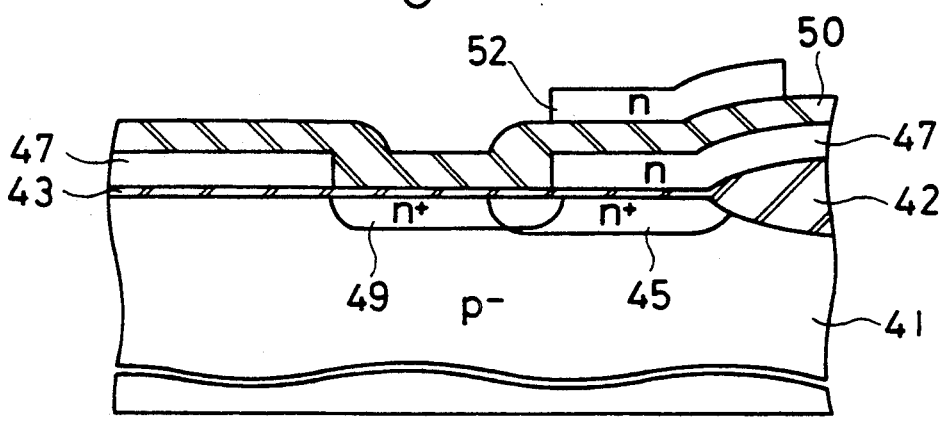
FIG. 57 is a cross-sectional view of a semiconductor wafer illustrated for describing a double gate structure TFT load type SRAM in accordance with the seventh embodiment of this invention.
Figure 58:
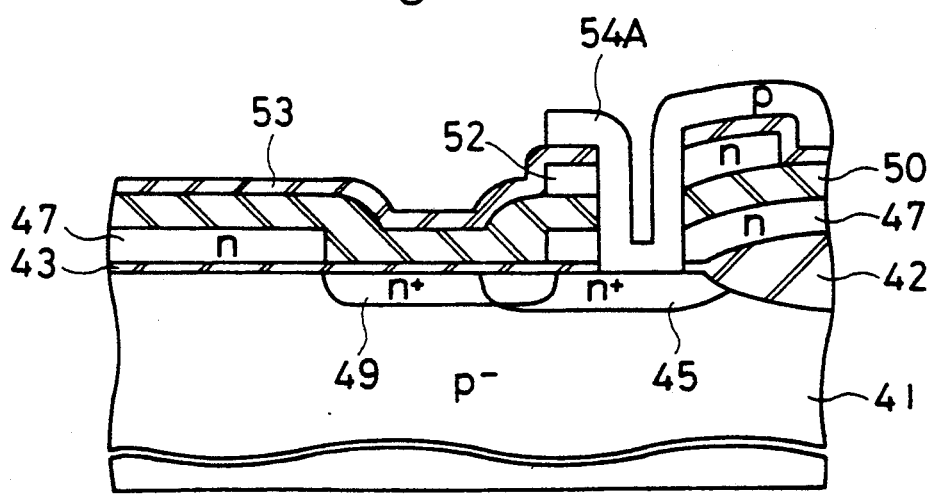
FIG. 58 is a cross-sectional view of a semiconductor wafer illustrated for describing a double gate structure TFT load type SRAM in accordance with the seventh embodiment of this invention.

FIGS. 56 through 58 are cross-sectional views of a semiconductor wafer illustrated for describing a TFT load type SRAM in accordance with the seventh embodiment of this invention.

Referring to FIG. 56, a field insulator layer 42, a gate insulator layer 43, the gate electrode 47 of a driver transistor, an n+-region 45, an n+-source region (not shown), and an n+-drain region 49 are produced on a silicon substrate 41 by employing the same steps as were employed for the sixth embodiment.

Referring to FIG. 57, an insulator 50 of $SiO_2$ having a thickness of e.g. 1,000 Å is produced by employing a CVD process. A second poly crystalline silicon layer having a thickness of e.g. 500 Å is produced by employing a CVD process. Phosphorus (n-type impurities) is diffused in the second poly crystalline silicon layer by the density of e.g. $10^{21}$ cm$^{-3}$ by employing a thermal diffusion process. The gate electrode 52 of a TFT is produced by patterning the second poly crystalline silicon layer by employing a resist mask and a RIE process conducted employing a mixture of $CCl_4$ and $O_2$ as the etching gas.

Referring to FIG. 58, the gate insulator layer 53 of the TFT having a thickness of e.g. 200 Å is produced by employing a CVD process. A contact hole is produced by applying a selective etching process to the gate insulator layer 53 of the TFT, the gate electrode 52 of the TFT, the insulator layer 50 of $SiO_2$, and the gate electrode 47 of the driver transistor, the selective etching process being a RIE process conducted with assistance by a resist mask and by employing a mixture of $CHF_3$ gas and He gas as the etching gas for $SiO_2$ and a mixture of HBr gas and He gas as the etching gas for Si. A third poly crystalline silicon layer having a thickness of e.g. 500 Å is produced by employing a CVD process. Boron ions (p-type impurities) are introduced into the source region and the drain region of the TFT by employing an ion implantation process conducted with assistance by a resist mask and with the dosage of e.g. $1 \times 10^{14}$ cm$^{-2}$ and the acceleration energy of e.g. 5 KeV. A source region (not shown), a drain region 54A and a channel region (not shown) of the double gate structure TFT, and $V_{cc}$ power supply line (not shown) are produced by patterning the third poly crystalline silicon layer by employing a RIE process conducted with assistance by a resist mask and by employing a mixture of $CCl_4$ and $O_2$ as the etching gas.

The drain region 54A contacts, in the contact hole, with the side of the gate electrode 52 of the TFT, the side of the gate electrode 47 of the driver transistor, and the top surface of the n+-region 45. Therefore, all of them are connected with the drain region 49 of the driver transistor.

In the seventh embodiment, the drain region 54A of the TFT penetrates from the top layer to the bottom layer, thereby a connection necessary for combining the TFT and the driver transistor is realized. Further, the gate insulator layer 43 is not damaged, and the quantity of the mask processes is decreased by one step in comparison with the process for producing an ordinary TFT type SRAM.

The foregoing description has clarified that the generic feature of the method for producing a semiconductor device of this invention is a combination of a step for producing a gate electrode of a first conductor layer which is piled on a gate insulator layer, a step for producing a drain region which is connected with a buried contact region which is located under the gate electrode, the step being conducted by employing the gate electrode as a mask, and a step for piling, on or over the gate electrode, a second conductor layer which is connected with the buried contact region through a contact hole produced in the gate electrode.

Further, the foregoing description has clarified that semiconductor devices and methods for producing the semiconductor devices having the following advantage were successfully provided.

The first advantage is that a gate insulator layer or a semiconductor substrate is not damaged during a step for producing a drain region of a driver transistor by employing a combination of the gate electrode of the driver transistor and a field insulator layer as a mask.

The second advantage is that semiconductor devices having good characteristics are provided.

The third advantage is that methods for producing semiconductor devices having good characteristics without being accompanied by an increase in steps for producing them.

Although the foregoing description was presented referring to specific embodiments, this is not meant to be construed in a limiting sense. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. A semiconductor device comprising:
    a substrate,
    an insulative layer formed on a surface of the substrate,
    a gate electrode of a first transistor, being comprised of a first conductor layer and disposed on a portion of the insulative layer so that a portion of the substrate is under the first conductor layer,
    a first diffusion region in the substrate as a drain region of a second transistor, being located at the surface of the substrate outside the portion of the substrate which is under the first conductor layer,
    a second diffusion region, being located in the substrate, at the surface of the substrate, the second diffusion region being connected with the first diffusion region,
    a contact hole, being formed through both the first conductor layer and the insulative layer to define an exposed portion of the substrate, where the second diffusion region is exposed, and
    a second conductor layer formed on the first conductor layer and the exposed portion of the substrate, the second conductor layer being connected with both second diffusion region and the first conductive layer through the contact hole.

2. A semiconductor device of claim 1, wherein said gate electrode of said first transistor is a laminate of said first and second conductor layers.

3. A semiconductor device comprising:
    a substrate,
    an insulative layer formed on a surface of the substrate,
    a gate electrode of a first transistor, being comprised of a first conductor layer and disposed on a portion of the insulative layer so that a portion of the substrate is under the first conductor layer, a first diffusion region in the substrate as a drain region of a second transistor, being located at the surface of the substrate outside the portion of the substrate which is under the first conductor layer, a second diffusion region, being located in the substrate, at the surface of the substrate, the second diffusion region being connected with the first diffusion region, at least one intermediate layer formed on the first conductor layer and the insulative layer, a contact hole, being formed through the at least one intermediate layer, the first conductor layer and the insulative layer to define an exposed portion of the substrate, where the second diffusion region is exposed, and a second conductor layer formed on the at least one intermediate layer and the exposed portion of the substrate, a portion of the at least one intermediate layer being between the first conductor layer and the second conductor layer, the second conductor layer being connected with both second diffusion region and the first conductor layer through the contact hole.

4. A semiconductor device of claim 3,
wherein the at least one intermediate layer comprises a first insulator layer arranged between said first conductor layer and said second conductor layer, and
wherein said second conductor layer is formed on said first insulator layer and is a gate electrode of a load TFT.

5. A semiconductor device of claim 3,
wherein the at least one intermediate layer comprises a first insulator layer arranged between said first conductor layer and said second conductor layer, and
wherein said second conductor layer is formed on said first insulator layer and is a resistor of a high resistance load.

6. A semiconductor device of claim 3,
wherein the at least one intermediate layer comprises a laminate of a first insulator layer, a gate electrode of a load TFT and a gate insulator layer of said load TFT, said laminate being formed in this order on said first conductor layer, and
wherein the second conductor layer is a drain region of said load TFT and is connected with a side portion of the gate electrode of said load TFT in addition to the first conductor layer and the second diffusion region, through the contact hole.

7. A semiconductor device of claim 3,
wherein the at least one intermediate layer comprises a laminate of a first insulator layer, a lower gate electrode of a double gate structure TFT working as a load, a lower gate insulator layer of said double gate structure TFT working as a load, a drain region of said double gate structure TFT working as a load, and an upper gate insulator layer of said double gate structure TFT working as a load, said laminate being formed in this order on the first conductor layer, and
wherein the second conductor layer is an upper gate electrode of said double gate structure TFT, said second conductor layer being connected with a side portion of the drain region of said double gate structure TFT, a side portion of the lower gate electrode of said double gate structure TFT in addition to the first conductor layer and the second diffusion region, through the contact hole.

8. A method for producing a semiconductor device comprising:
a step for forming a field insulator layer, for isolation of ingredients, on a first portion of a semiconductor substrate,
a step for producing a gate insulator layer of a first transistor on a second portion of the substrate,
a step for forming a first conductor layer on the field insulator layer and the gate insulator layer,
a step for producing a second diffusion region by introducing impurities into the substrate,
a step for producing a contact hole through said first conductor layer and the gate insulator layer thereby exposing a side portion of said first conductor layer and said second diffusion region,
a step for forming a second conductor layer over said first conductor layer and the exposed second diffusion region, the second conductor layer contacting the side portion of the first conductor layer, in said contact hole, to thereby electrically connect said first conductor layer and said second diffusion region,
a step for patterning said first conductor layer and said second conductor layer to thereby produce wires and electrodes, said electrodes including a gate electrode of the first transistor, said gate electrode being comprised of at least the first conductor layer, and
a step for producing a first diffusion region in the substrate and connected with said second diffusion region, the first diffusion region being produced by introducing impurities into the substrate and using the patterned first and second conductor layers, including the gate electrode of the first transistor, as a mask.

9. A method for producing a semiconductor device of claim 8,
wherein the step for producing the second diffusion region is performed after the step for producing the gate insulator layer of said first transistor and after the step for producing the field insulator layer,
wherein the step for producing said first conductor layer is performed after the step for producing the second diffusion region, and
wherein the second diffusion region is produced by introducing impurities through said gate insulator layer of said first transistor using a mask.

10. A method for producing a semiconductor device of claim 8,
wherein the step for producing said second diffusion region uses a mask layer and is performed after the step for forming said field insulator layer, and
wherein the step for producing the gate insulator layer of said first transistor and the step for producing said first conductor layer are both performed after the step for forming said second diffusion region.

11. A method for producing a semiconductor device comprising:
a step for producing a field insulator layer, for isolation of ingredients, on a first portion of a semiconductor substrate,
a step for producing a gate insulator layer of a first transistor on a second portion of the substrate, a step for forming a first conductor layer on the field insulator layer and the gate insulator layer, a step for producing a second diffusion region by introducing impurities into the substrate, a step for patterning said first conductor layer to thereby produce wires and a gate electrode of said first transistor, a step for producing a first diffusion region in the substrate and connected with said second diffusion region, the first diffusion region being produced by introducing impurities into the substrate and using said gate electrode of said first transistor as a mask, a step for forming at least one intermediate layer on the first conductor layer, a step for producing a contact hole through the at least one intermediate layer, said first conductor layer and the gate insulator layer thereby exposing a side portion of said first conductor layer and said second diffusion region, and a step for forming a second conductor layer over the at least one intermediate layer and the exposed second diffusion region so that a portion of the at least one intermediate layer is between the first conductor layer and the second conductor layer, the second conductor layer contacting the side portion of the first conductor layer, in said contact hole, to thereby electrically connect the first conductor layer and said second diffusion region.

12. A method for producing a semiconductor device of claim 11,
   wherein the at least one intermediate layer is an insulator layer, and
   wherein the method for producing the semiconductor device further comprises a step for producing a gate electrode of a load TFT by patterning said second conductor layer.

13. A method for producing a semiconductor device of claim 11,
   wherein the step of forming the at least one intermediate layer includes the substeps of:
      a step for producing a first insulator layer on the first conductor layer,
      a step for forming a gate electrode of a TFT by depositing and patterning a conductor layer, and
      a step for forming a gate insulator layer of said TFT,
   wherein the step for producing a contact hole exposes a side portion of the gate electrode of said TFT,
   wherein in the step for forming the second conductor layer, the second conductor layer contacts the side portion of the gate electrode of said TFT, and
   wherein the method of producing a semiconductor device further comprises a step for patterning said second conductor layer thereby producing a drain region of said TFT.

14. A method for producing a semiconductor device of claim 11,
   wherein the step for forming the at least one intermediate layer includes the substeps of:
      a step for producing a first insulator layer on the first conductor layer,
      a step for forming a lower gate electrode of a TFT on the first insulator layer,
      a step for forming a lower gate insulator layer of said TFT on the lower gate electrode of said TFT,
      a step for forming a drain region of said TFT on the lower gate insulator layer of said TFT, and
      a step for forming a second insulator layer on the drain region of said TFT,
   wherein the step for producing a contact hole exposes a side portion of the drain region of said TFT and a side portion of the lower gate electrode of said TFT,
   wherein in the step for forming the second conductor layer, said second the second conductor layer contacts the side portion of the drain region of said TFT and the side portion of the lower gate electrode of said TFT, and
   wherein the method of producing a semiconductor device further comprises a step for patterning said second conductor layer thereby producing an upper gate electrode of said TFT.

15. A method for producing a semiconductor device of claim 12,
   wherein the step for producing the second diffusion region is performed after the step for producing the gate insulator layer of said first transistor and after the step for producing the field insulator layer,
   wherein the step for producing said first conductor layer is performed after the step for producing the second diffusion region, and
   wherein the second diffusion region is produced by introducing impurities through said gate insulator layer of said first transistor using a mask.

16. A method for producing a semiconductor device of claim 12,
   wherein the step for producing said second diffusion region uses a mask layer and is performed after the step for forming said field insulator layer, and
   wherein the step for producing the gate insulator layer of said first transistor and the step for producing said first conductor layer are both performed after the step for forming said second diffusion region.

17. A method for producing a semiconductor device of claim 13,
   wherein the step for producing the second diffusion region is performed after the step for producing the gate insulator layer of said first transistor and after the step for producing the field insulator layer,
   wherein the step for producing said first conductor layer is performed after the step for producing the second diffusion region, and
   wherein the second diffusion region is produced by introducing impurities through said gate insulator layer of said first transistor using a mask.

18. A method for producing a semiconductor device of claim 13,
   wherein the step for producing said second diffusion region uses a mask layer and is performed after the step for forming said field insulator layer, and
   wherein the step for producing the gate insulator layer of said first transistor and the step for producing said first conductor layer are both performed after the step for forming said second diffusion region.

19. A method for producing a semiconductor device of claim 14,
   wherein the step for producing the second diffusion region is performed after the step for producing the gate insulator layer of said first transistor and after the step for producing the field insulator layer,
   wherein the step for producing said first conductor layer is performed after the step for producing the second diffusion region, and wherein the second diffusion region is produced by introducing impurities through said gate insulator layer of said first transistor using a mask.

20. A method for producing a semiconductor device of claim 14,
wherein the step for producing said second diffusion region uses a mask layer and is performed after the step for forming said field insulator layer, and
wherein the step for producing the gate insulator layer of said first transistor and the step for producing said first conductor layer are both performed after the step for forming said second diffusion region.

* * * * *

UNITED STATES PATENT AND TRADEMARK OFFICE
CERTIFICATE OF CORRECTION

PATENT NO. : 5,323,046
DATED : June 21, 1994
INVENTOR(S) : Taiiji EMA et al.

It is certified that error appears in the above-indentified patent and that said Letters Patent is hereby corrected as shown below:

Column 3, line 38, "ia" should be --is--.

Column 15, line 64, "thenext" should be --the next--.

Column 16, line 9, after "layer" insert --47a--.

Column 26, line 8, delete "the second".

Signed and Sealed this

Twenty-ninth Day of November, 1994

Attest:

BRUCE LEHMAN

*Attesting Officer*     *Commissioner of Patents and Trademarks*